(12) United States Patent
Nogami et al.

(10) Patent No.: US 12,103,288 B2
(45) Date of Patent: Oct. 1, 2024

(54) AFFIXING DEVICE

(71) Applicant: MITSUI CHEMICALS TOHCELLO, INC., Tokyo (JP)

(72) Inventors: Masao Nogami, Nagoya (JP); Akimitsu Morimoto, Kawasaki (JP)

(73) Assignee: MITSUI CHEMICALS TOHCELLO, INC., Tokyo (JP)

( * ) Notice: Subject to any disclaimer, the term of this patent is extended or adjusted under 35 U.S.C. 154(b) by 123 days.

(21) Appl. No.: 17/439,188

(22) PCT Filed: Mar. 26, 2020

(86) PCT No.: PCT/JP2020/013847
§ 371 (c)(1),
(2) Date: Sep. 14, 2021

(87) PCT Pub. No.: WO2020/196795
PCT Pub. Date: Oct. 1, 2020

(65) Prior Publication Data
US 2022/0157626 A1    May 19, 2022

(30) Foreign Application Priority Data
Mar. 27, 2019   (JP) ................................ 2019-061828

(51) Int. Cl.
*B32B 37/10* (2006.01)
*B32B 37/12* (2006.01)
(Continued)

(52) U.S. Cl.
CPC .............. *B32B 37/10* (2013.01); *B32B 37/12* (2013.01); *H01L 21/67092* (2013.01); *H01L 21/6836* (2013.01)

(58) Field of Classification Search
CPC ............... B32B 37/10; B32B 37/0046; H01L 21/67092
See application file for complete search history.

(56) References Cited

U.S. PATENT DOCUMENTS 7,438,631 B2   10/2008   Nagamoto et al.
9,559,073 B2   1/2017   Tamura et al.
(Continued)

FOREIGN PATENT DOCUMENTS

| JP | 2000017239 A | 1/2000 |
|---|---|---|
| JP | 2005123382 A | 5/2005 |

(Continued)

OTHER PUBLICATIONS

Written Opinion/Search Report issued on Feb. 24, 2023, by the Intellectual Property Office of Singapore in corresponding Singapore Patent Application No. 11202109556Q. (12 pages).

(Continued)

*Primary Examiner* — Carson Gross
(74) *Attorney, Agent, or Firm* — Panitch Schwarze Belisario & Nadel LLP

(57) ABSTRACT

Described is an affixing apparatus capable of flattening a surface of a film affixed to a main surface of a plate-shaped body. An affixing apparatus for affixing the film to the plate-shaped body includes: a plate-shaped mounting member provided with a mounting portion on which the plate-shaped body is mounted; a plate-shaped pressing member installed at a position facing the mounting member; and a support member installed at an outer edge of the mounting portion so as to be positioned between the mounting member and the pressing member.

10 Claims, 13 Drawing Sheets

(51) Int. Cl.
*H01L 21/67* (2006.01)
*H01L 21/683* (2006.01)

(56) References Cited

U.S. PATENT DOCUMENTS

| | | | |
|---|---|---|---|
| 10,727,128 | B2 | 7/2020 | Priewasser et al. |
| 2007/0066184 | A1 | 3/2007 | Nagamoto et al. |
| 2010/0038009 | A1 | 2/2010 | Okuno et al. |
| 2013/0306215 | A1 | 11/2013 | Toida |
| 2014/0079947 | A1 | 3/2014 | Tamura et al. |
| 2018/0315610 | A1 | 11/2018 | Sekiya et al. |
| 2018/0330938 | A1 | 11/2018 | Sekiya |
| 2019/0252254 | A1 | 8/2019 | Priewasser et al. |
| 2022/0153009 | A1 | 5/2022 | Nogami et al. |

FOREIGN PATENT DOCUMENTS

| | | | | |
|---|---|---|---|---|
| JP | 2008066684 | A | | 3/2008 |
| JP | 2008-166459 | A | | 7/2008 |
| JP | 2009246196 | A | | 10/2009 |
| JP | 2010-118584 | A | | 5/2010 |
| JP | 2012059929 | A | | 3/2012 |
| JP | 2012099622 | A | * | 5/2012 |
| JP | 2012199406 | A | | 10/2012 |
| JP | 2013048296 | A | | 3/2013 |
| JP | 2013239564 | A | | 11/2013 |
| JP | 2013243309 | A | | 12/2013 |
| JP | 2015082619 | A | | 4/2015 |
| SG | 189515 | A1 | | 5/2013 |
| SG | 10201900566 | P | | 9/2019 |
| WO | 2013021644 | A1 | | 2/2013 |

OTHER PUBLICATIONS

Extended European Search Report issued on Mar. 14, 2023, by the European Patent Office in corresponding European Application No. 20778241.8 (12 pages).

Office Action issued on Jan. 31, 2023, by the Taiwanese Patent Office in corresponding Taiwan Patent Application No. 109110327, and an English Translation of the Office Action. (10 pages).

Extended European Search Report dated Jan. 26, 2023, issued by the European Patent Office in corresponding European Application No. 20777870.5. (12 pages).

Office Action (Request for the Submission of an Opinion) issued on Dec. 12, 2022, by the Korean Intellectual Property Office in corresponding Korean Patent Application No. 10-2021-7031634, and an English translation of the Office Action. (17 pages).

Office Action issued by the U.S. Patent and Trademark Office in the U.S. Appl. No. 17/439,238 mailed Oct. 6, 2022, U.S. Patent and Trademark Office, Alexandria, VA. (8 pages).

Written Opinion issued on Jun. 14, 2023, by the Intellectual Property Office of Singapore in corresponding Singaporean Patent Application No. 11202109557S (8 pages).

Office Action (Communication pursuant to Article 94(3) EPC) issued Oct. 11, 2023, by the European Patent Office in corresponding European Patent Application No. 20 777 870.5. (6 pages).

Office Action (Request for the Submission of an Opinion) issued Jul. 19, 2023, by the Korean Intellectual Property Office in corresponding Korean Patent Application No. 10-2021-7031631, and an English translation of the Office Action. (14 pages).

Office Action issued on Jun. 26, 2023, by the Korean Intellectual Property Office in Korean Patent Application No. 10-2021-7031634, with an English translation of the Office Action (8 pages).

Office Action (Communication pursuant to Article 94(3) EPC) issued Oct. 26, 2023, by the European Patent Office in European Patent Application No. 20 778 241.8. (5 pages).

Written Opinion issued Oct. 11, 2023, by the Intellectual Property Office of Singapore in Singapore Patent Application No. 11202109556Q. (8 pages).

Office Action issued by the U.S. Patent and Trademark Office in U.S. Appl. No. 17/439,238 mailed Sep. 18, 2023, U.S. Patent and Trademark Office, Alexandria, VA. (5 pages).

Office Action issued Sep. 20, 2023, by the Taiwan Patent Office in Taiwanese Patent Application No. 109110320 and an English translation of the Office Action. (12 pages).

Written Opinion issued on Nov. 17, 2023, by the Intellectual Property Office of Singapore in corresponding Singapore Patent Application No. 11202109557S. (7 pages).

Office Action (The First Office Action) issued Nov. 1, 2023, by the State Intellectual Property Office of People's Republic of China in corresponding Chinese Patent Application No. 202080024235.8 and an English translation of the Office Action. (18 pages).

Office Action (First Notice of Examination Action) issued on Dec. 27, 2023, by the State Intellectual Property Office in Chinese Patent Application No. 202080024347.3, and an English translation of the Office Action. (28 pages).

Office Action (Notice of Final Rejection) issued on Feb. 2, 2024, by the Korean Intellectual Property Office in corresponding Korean Patent Application No. 10-2021-7031631, and an English translation of the Office Action. (9 pages).

Office Action (Notice of Reasons for Refusal) issued on May 7, 2024, by the Japanese Patent Office in Japanese Patent Application No. 2021-509617, and an English translation of the Office Action. (10 pages).

* cited by examiner

AFFIXING DEVICE

TECHNICAL FIELD

The present invention relates to an affixing apparatus for affixing a film to a plate-shaped body such as a semiconductor wafer.

BACKGROUND ART

Examples of plate-shaped bodies to which a film is affixed include semiconductor wafers for semiconductor components. After a circuit or the like is formed on a main surface of a semiconductor wafer, the back surface opposite to the main surface is ground to a desired thickness. In order to protect the circuit or the like on the main surface at the time of grinding the back surface, a film such as a protective film is affixed to the main surface of the semiconductor wafer.

A general affixing apparatus includes a mounting member on which a semiconductor wafer is mounted, and a pressing member such as a pasting roller installed at a position facing the mounting member. This affixing apparatus is configured to affix a film to a main surface by pressing the film against the main surface with a pressing member such as an affixing roller.

Here, some semiconductor wafers have, for example, a plurality of bumps on its main surface, so that the main surface is uneven due to the tops of the bumps. When a film is affixed to such a main surface using the above-described affixing apparatus, the surface of the film pressed against the main surface becomes uneven following the unevenness due to the tops of the bumps. When the surface of the film becomes uneven, defects such as vacuum leakage may occur when the semiconductor wafer is fixed to the mounting member of the affixing apparatus via the film. Patent Literature 1 is known as a technique for eliminating such defects.

Specifically, Patent Literature 1 discloses a film provided with an unevenness absorbent resin layer and the like as a film used for a semiconductor wafer. The film is devised such that unevenness is less likely to occur on the surface of the film affixed to the main surface by an unevenness absorbent resin layer, a step absorption layer, or the like.

CITATIONS LIST

Patent Literature

Patent Literature 1: JP 2000-17239 A

SUMMARY OF THE INVENTION

Technical Problems

The above-described technique is intended to suppress the formation of unevenness on a surface of a film by devising the configuration of the film.

However, even when the above-described technique is used, there is a case where a defect such as vacuum leakage occurs due to the shape or the like of the affixing surface (main surface) of a plate-shaped body. This defect is particularly likely to occur when the plate-shaped body has a step portion at a peripheral edge part of the affixing surface (main surface).

The present invention has been made in view of the above problems, and an object of the present invention is to provide an affixing apparatus capable of suppressing the formation of unevenness on a surface of a film affixed to a main surface of a plate-shaped body without being affected by the shape of the main surface and flattening the surface of the film.

Solutions to Problems

As a means for solving the above problems, the present invention is as follows.

[1] The invention of an affixing apparatus according to claim 1 is an affixing apparatus for affixing a film to a plate-shaped body, the affixing apparatus comprising:
 a plate-shaped mounting member provided with a mounting portion on which the plate-shaped body is mounted;
 a plate-shaped pressing member installed at a position facing the mounting member; and
 a support member installed at an outer edge of the mounting portion so as to be positioned between the mounting member and the pressing member.

[2] The invention according to claim 2 is the invention of the affixing apparatus according to claim 1,
 wherein the pressing member has a function of pressing the film against a main surface of the plate-shaped body, and
 wherein the support member has a function of supporting an edge part of the film when the film is pressed by the pressing member.

[3] The invention according to claim 3 is the invention of the affixing apparatus according to claim 1 or 2, further comprising an arrangement device that arranges the film on the main surface of the plate-shaped body.

[4] The invention according to claim 4 is the invention of the affixing apparatus according to any one of claims 1 to 3, further comprising a heating device that heats the film.

[5] The invention according to claim 5 is the invention of the affixing apparatus according to any one of claims 1 to 4,
 wherein the affixing apparatus has a function of sandwiching the edge part of the film between the support member and the pressing member and compressing the edge part in a thickness direction of the film.

[6] The invention according to claim 6 is the invention of the affixing apparatus according to any one of claims 1 to 5,
 wherein the plate-shaped body comprises a notch-shaped step portion at a peripheral edge part of the main surface to which the film is affixed, and
 wherein the support member is installed at an outer edge of the mounting portion such that the support member corresponds to the step portion.

[7] The invention according to claim 7 is the invention of the affixing apparatus according to any one of claims 1 to 6,
 wherein the plate-shaped body is a semiconductor wafer, and
 wherein the film is a protective film for a semiconductor wafer.

[8] The invention according to claim 8 is the invention of the affixing apparatus according to claim 7,
 wherein the semiconductor wafer has, on the main surface, a first region in which bumps are arranged, and a second region which includes at least a part of a peripheral edge of the main surface and in which no bumps are arranged, and
 wherein the notch-shaped step portion is formed by the second region.

[9] The invention of an affixing apparatus according to claim 9 is an affixing apparatus for affixing a film to a plate-shaped body, characterized in that;

the plate-shaped body comprises a step portion on a main surface to which the film is affixed; and that the affixing apparatus comprises:

a plate-shaped mounting member provided with a mounting portion on which the plate-shaped body is mounted;

a plate-shaped pressing member installed at a position facing the mounting member;

an arrangement device installed between the mounting member and the pressing member to arrange the film on the main surface of the plate-shaped body; and a processing device that forms a part with a relatively large thickness in the film arranged on the main surface of the plate-shaped body, corresponding to the step portion.

[10] The invention according to claim 10 is the invention of the affixing apparatus according to claim 9, further including a heating device that heats the film.

[11] The invention according to claim 11 is the invention of the affixing apparatus according to claim 9 or 10, wherein the plate-shaped body is a semiconductor wafer, and wherein the film is a protective film for a semiconductor wafer.

Advantageous Effects of Invention

According to the affixing apparatus of the present invention, the film surface can be flattened without being affected by the shape of the main surface of the plate-shaped body.

DESCRIPTION OF EMBODIMENTS

Hereinafter, the present invention will be described with reference to the drawings. The particulars described herein are given by way of example and for the purpose of illustrative discussion of the embodiments of the present invention, and are presented for the purpose of providing what is believed to be the description from which the principles and conceptual features of the present invention can be most effectively and readily understood. In this point, the embodiments are necessary for fundamental comprehension of the present invention and how some embodiments of the present invention are embodied in practice is clearly shown to those skilled in the art by an explanation in connection with drawings without intending to indicate a structural detail of the present invention above a certain level.

[1] Affixing Apparatus (First Invention)

Figure 1:
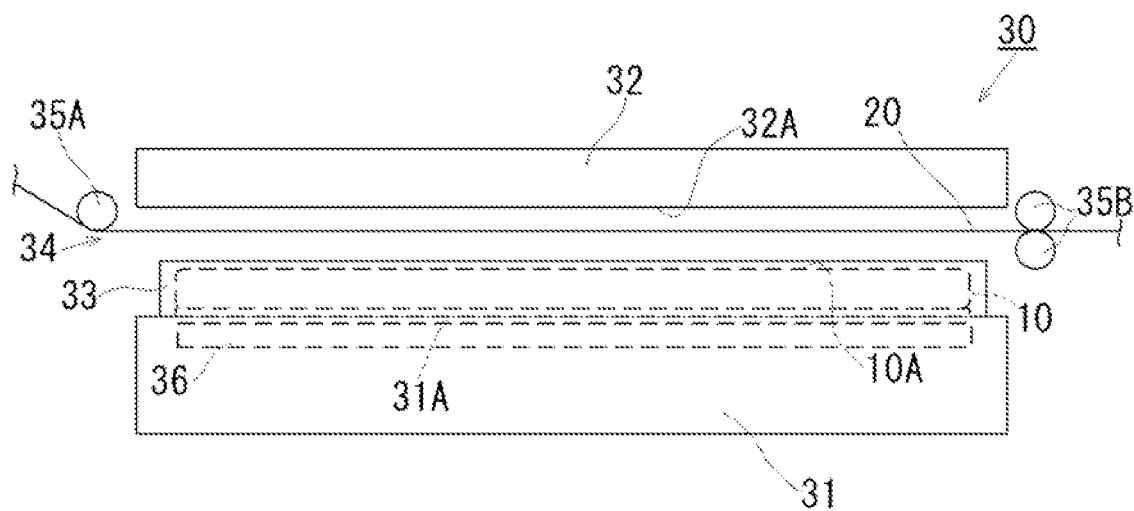
FIG. 1 is a front view for explaining an affixing apparatus of a first invention.
Figure 2:
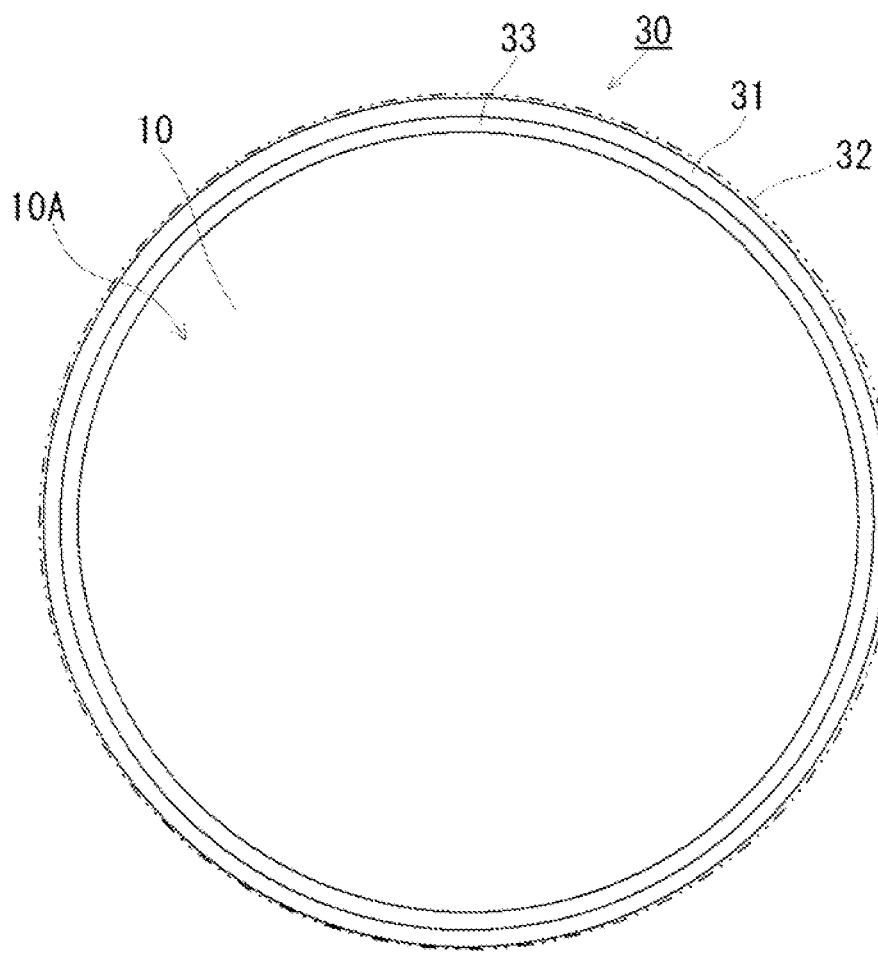
FIG. 2 is a plan view for explaining the affixing apparatus of the first invention.

An affixing apparatus of a first invention is an affixing apparatus 30 for affixing a film (20) to a plate-shaped body (10). As illustrated in FIGS. 1 and 2, the affixing apparatus 30 includes a mounting member 31, a pressing member 32, and a support member 33.

The mounting member 31 has a plate shape. The mounting member 31 is provided with a mounting portion 31A on which the plate-shaped body (10) is mounted.

The pressing member 32 has a plate shape. The pressing member 32 is installed at a position facing the mounting member 31.

The support member 33 is positioned between the mounting member 31 and the pressing member 32. The support member 33 is installed at an outer edge of the mounting portion 31A.

In FIG. 1, the plate-shaped body (10) and the mounting portion 31A are indicated by dotted lines. In FIG. 2, the pressing member 32 is indicated by a two-dot chain line.

In the following description, a main surface 10A of the plate-shaped body (10) refers to a surface of the plate-shaped body (10) which serves as an affixing surface for the film (20). For example, in FIG. 1, the main surface 10A of the plate-shaped body (10) is a surface (top surface) of the plate-shaped body (10).

The affixing apparatus 30 specifically includes an affixing device. This affixing device is a mechanism that fixes the plate-shaped body (10) and presses and affixes the film (20) to the main surface 10A of the plate-shaped body (10).

The affixing device includes the mounting member 31 and the pressing member 32.

The mounting member 31 can have a function of fixing the plate-shaped body (10) mounted on the mounting portion 31A.

The pressing member 32 can have a function of pressing the film (20) against the main surface 10A of the plate-shaped body (10) mounted on the mounting portion 31A.

The support member 33 can have a function of supporting an edge part (peripheral edge part) of the film (20) when the film (20) is pressed by the pressing member 32. The edge part of the film (20) supported by the support member 33 can be compressed in its thickness direction by being sandwiched between the pressing member 32 and the support member 33.

That is, in the affixing apparatus 30, the affixing device can include a compression device. This compression device is a mechanism that compresses the edge part of the film (20) in its thickness direction. The compression device includes the pressing member 32 and the support member 33.

The affixing apparatus 30 may further include an arrangement device 34. The arrangement device 34 is a mechanism that arranges the film (20) on the main surface 10A of the plate-shaped body (10).

The configuration and the like of the arrangement device 34 are not particularly limited. The arrangement device 34 can include, for example, a guide roller 35A and a pair of upper and lower traction rollers 35B (see FIG. 1).

The guide roller 35A is installed so as to be displaced outward from a position immediately above the mounting portion 31A. The guide roller 35A can have a function of guiding the film (20) between the mounting member 31 and the pressing member 32.

The pair of traction rollers 35B faces the guide roller 35A in the horizontal direction, and is installed so as to be displaced outward from the position immediately above the mounting portion 31A. The pair of traction rollers 35B can sandwich the film (20) therebetween and tow it. That is, the pair of traction rollers 35B can have a function of disposing, on the main surface 10A, the film (20) guided between the mounting member 31 and the pressing member 32 by the guide roller 35A.

The affixing apparatus 30 may further include a heating device. This heating device is a mechanism that heats the film (20).

The configuration and the like of the heating device are not particularly limited. This heating device can be installed, for example, by interiorly mounting the heater 36 in the mounting member 31 (see FIG. 1).

Hereinafter, the mounting member 31, the pressing member 32, and the support member 33 of the affixing apparatus 30 will be described in detail.

(1) Mounting Member

The type, configuration, and the like of the mounting member 31 are not particularly limited as long as it has a plate shape and is provided with the mounting portion 31A on which the plate-shaped body (10) is mounted.

Usually, a chuck table can be used as the mounting member 31. When a chuck table is used as the mounting member 31, the mounting portion 31A can be a chuck area provided on the chuck table.

In addition, it is preferable to use a vacuum suction table, among chuck tables, as the mounting member 31. The vacuum suction table can suitably fix the plate-shaped body (10) and prevent the plate-shaped body (10) from being contaminated or damaged.

(2) Pressing Member

The shape, configuration, and the like of the pressing member 32 are not particularly limited as long as it can press the film (20) against the main surface 10A of the plate-shaped body (10). For example, the shape of the pressing member 32 can be circular in plan view as indicated by a two-dot chain line in FIG. 2.

The pressing member 32 is installed at a position above the mounting portion 31A. Further, the pressing member 32 is configured to be able to approach or separate from the mounting portion 31A.

The configuration of bringing the pressing member 32 close to or separate from the mounting portion 31A is not particularly limited. For example, the pressing member 32 can be turnably attached, at its one end edge, to the affixing apparatus 30, and configured to approach the mounting portion 31A when being flipped down and to separate from the mounting portion 31A when being flipped up.

In addition, the pressing member 32 can be attached to a rail or the like provided in the affixing apparatus 30 so as to extend in the thickness direction of the plate-shaped body (10) in such a manner that it can be freely raised or lowered, and configured to approach the mounting portion 31A when being lowered and to separate from the mounting portion 31A when being raised. In addition, the pressing member 32 is fixed at a position above the mounting portion 31A, and the mounting member 31 is configured to be freely raised and lowered. The mounting portion 31A can be configured to approach the pressing member 32 when the mounting member 31 is raised and to separate from the pressing member 32 when the mounting member 31 is lowered.

In the pressing member 32, a pressing surface 32A in contact with the film (20) is preferably a flat surface (see FIG. 1). When the pressing surface 32A is a flat surface, the surface of the film (20) pressed by the pressing surface 32A can be flattened.

The hardness of the pressing surface 32A is a Mohs hardness of preferably 2.5 to 8.5, more preferably 3 to 7, still more preferably 4 to 6. In this case, deformation of the pressing surface 32A can be suppressed, and the pressing surface 32A can be maintained to be flat.

The material of the pressing surface 32A is not particularly limited. For example, from the viewpoint of satisfying the Mohs hardness, a metal such as iron, copper, aluminum, steel, stainless steel, or an aluminum alloy, or an inorganic material such as glass or ceramics can be used as the material of the pressing surface 32A.

For example, the pressing member 32 can be configured such that only the pressing surface 32A is formed of the inorganic material, and the portion other than the pressing surface 32A is formed of a synthetic resin.

(3) Support Member

The configuration and the like of the support member 33 are not particularly limited.

The shape of the support member 33 is not particularly limited as long as it can be installed at an outer edge of the mounting portion 31A and can support the edge part (peripheral edge part) of the film (20). Examples of the shape of the support member 33 include an annular shape, a fan shape, and an arc shape in plan view. For example, as illustrated in FIG. 2, the support member 33 can have an annular shape enclosing the entire plate-shaped body (10) inside in plan view.

The material of the support member 33 is not particularly limited. As the compression device, it is preferable that the support member 33 can sandwich the edge part (peripheral edge part) of the film (20) with the pressing member 32 and compress it in its thickness direction. Examples of the material of the support member 33 include thermoplastic resins such as engineering plastics and super engineering plastics, and thermosetting resins, in addition to the inorganic materials such as metals listed for the pressing member 32.

Figure 3:
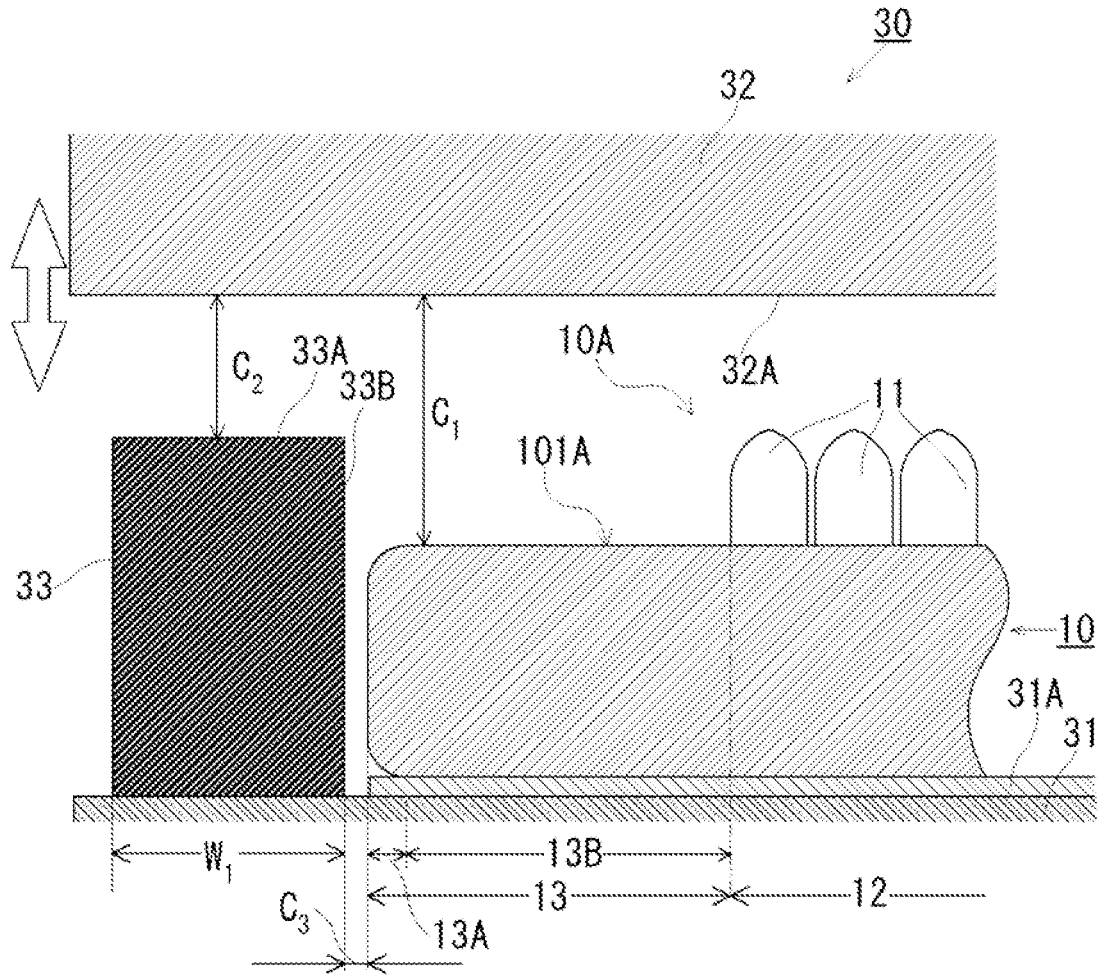
FIG. 3 is an enlarged cross-sectional view for explaining the affixing apparatus of the first invention.

In the support member 33, a support surface 33A that supports the edge part (peripheral edge part) of the film (20) can be parallel to the pressing surface 32A of the pressing member 32, for example, as illustrated in FIG. 3. In this case, the edge part (peripheral edge part) of the film (20) can be suitably compressed between the support member 33 and the pressing member 32.

Figure 4:
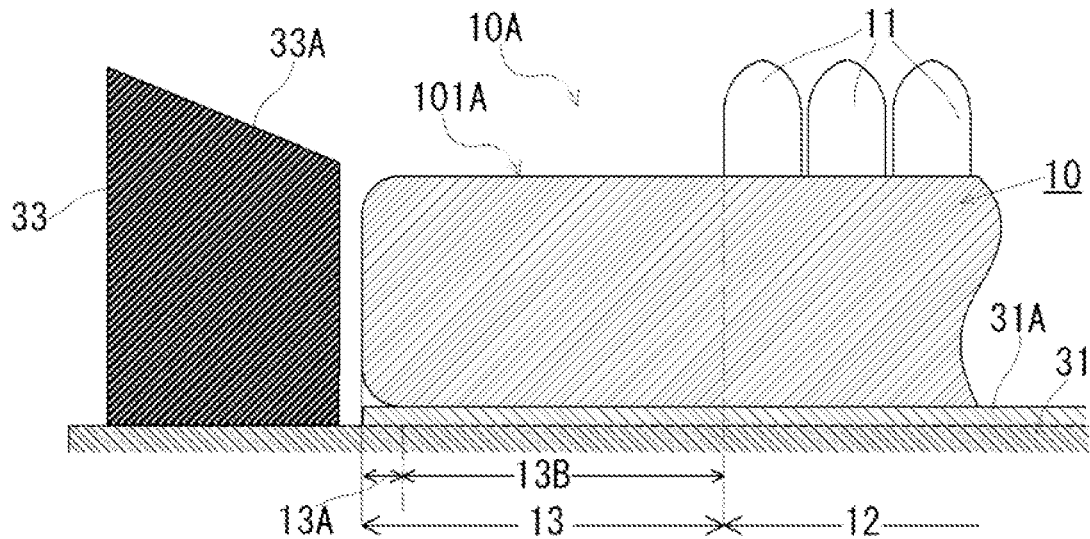
FIG. 4 is an enlarged cross-sectional view for explaining a modification of a support member.

Alternatively, as illustrated in FIG. 4, the support surface 33A can be inclined so as to face the mounting portion 31A side (the main surface 10A side of the plate-shaped body (10)).

As illustrated in FIG. 3, the support member 33 preferably needs a certain width $W_1$ or more in plan view. In general, the width $W_1$ is preferably 1 to 20 mm, more preferably 2 to 15 mm, still more preferably 3 to 10 mm. When the width $W_1$ falls within the range, the support member 33 can suitably support the edge part (peripheral edge part) of the film (20) and compress it in the thickness direction.

The position of the support surface 33A of the support member 33 is not particularly limited. In general, the position of the support surface 33A can be set in consideration of the positional relationship with the main surface 10A of the plate-shaped body (10).

Here, as for the positional relationship between the support surface 33A and the main surface 10A, a clearance between the main surface 10A of the plate-shaped body (10) and the pressing surface 32A of the pressing member 32 is defined as $C_1$, and a clearance between the support surface 33A of the support member 33 and the pressing surface 32A is defined as $C_2$, as illustrated in FIG. 3.

For example, in the case where the compression device having the support member 33 and the pressing member 32 is caused to suitably function, $C_1 > C_2$ is preferably satisfied. In the case of $C_1 > C_2$, the support surface 33A of the support member 33 is arranged at a position higher than a flat surface (blank region surface 101A of a semiconductor wafer 10) of the main surface 10A of the plate-shaped body (10).

Note that the clearance $C_1$ and the clearance $C_2$ can also have a relationship of $C_1 = C_2$ or $C_1 < C_2$.

The positional relationship between the support surface 33A and the main surface 10A will be described in more detail with reference to FIGS. 5(a) and 5(b).

Here, the plate-shaped body (10) is the semiconductor wafer 10, and the semiconductor wafer 10 has the blank region surface 101A on the main surface 10A. In FIGS. 5(a) and 5(b), the position of the blank region surface 101A is defined as $P_1$, the position of the support surface 33A of the support member 33 is defined as $P_2$, and the distance between $P_1$ and $P_2$ is defined as $d_1$ (μm) or $d_2$ (μm).

Figure 5A:
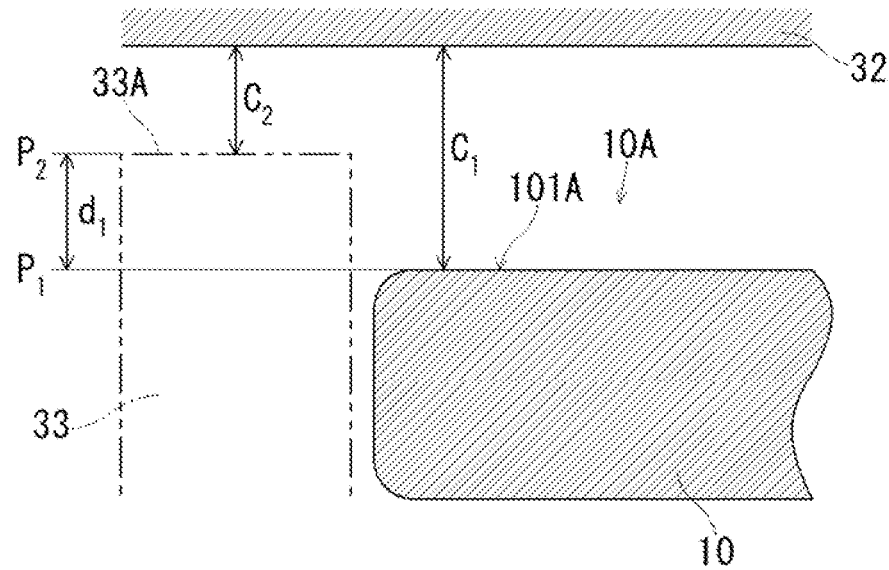
FIGS. 5($a$) and 5($b$) are enlarged cross-sectional views for explaining a positional relationship of a support surface in the support member.

In a case where $C_1$ and $C_2$ satisfy $C_1 > C_2$ (see FIG. 5(a)), it is preferable that $50 \leq d_1$ (μm) 2000, and it is more preferable that $100 \leq d_1$ (μm) 1000.

Figure 5B:
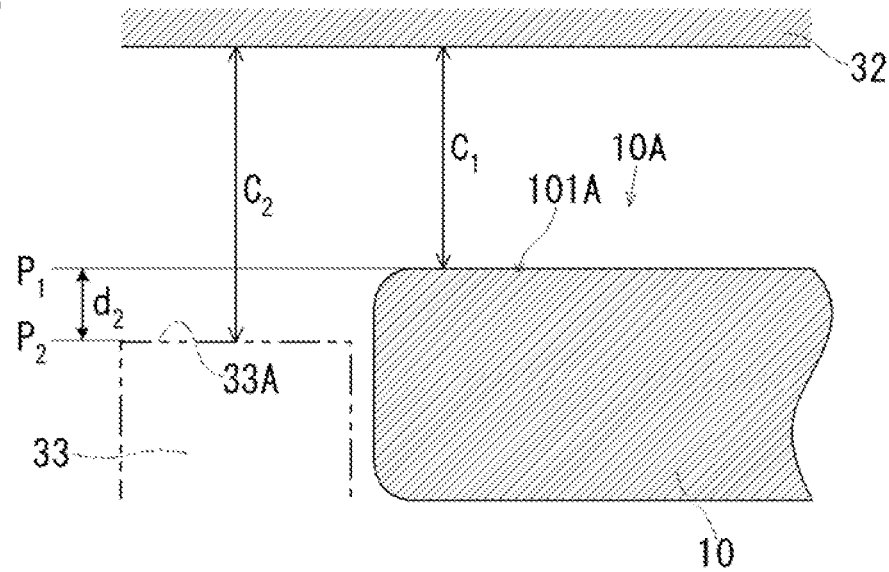

In a case where $C_1$ and $C_2$ satisfy $C_1 < C_2$ (see FIG. 5(b)), it is preferable that $0 < d_2$ (μm) $< 400$, it is more preferable that $10 \leq d_2$ (μm) $\leq 300$, and it is still more preferable that $50 \leq d_2$ (μm) $\leq 200$.

In the support member 33, an inner peripheral surface 33B can be perpendicular to the surface of the mounting portion 31A, for example, as illustrated in FIG. 3. In this case, the inner peripheral surface 33B of the support member 33 is also substantially perpendicular to the main surface 10A of the plate-shaped body (10) positioned on the mounting portion 31A. The support member 33 whose inner peripheral surface 33B is substantially perpendicular to the main surface 10A can suitably sandwich the edge part (peripheral edge part) of the film (20) arranged on the main surface 10A between the support member 33 and the pressing member 32, or can press the edge part against the inner peripheral surface 33B of the support member 33.

In addition, in the support member 33, the shortest distance between the inner peripheral surface 33B and a side surface (peripheral surface) of the plate-shaped body (10) in plan view is preferably set to be equal to or less than a certain value. The shortest distance between the inner peripheral surface 33B and the side surface (peripheral surface) of the plate-shaped body (10) is defined as a clearance $C_3$ as illustrated in FIG. 3. Specifically, the clearance $C_3$ can be preferably less than 1 mm, more preferably 0.5 mm or less, still more preferably 0.3 mm or less. Most preferably, the clearance $C_3$ is 0 mm, that is, the side surface (peripheral surface) of the plate-shaped body (10) is in contact with the inner peripheral surface 33B of the support member 33.

(4) Plate-Shaped Body

The plate-shaped body (10) will be described in detail.

The plate-shaped body (10) is not particularly limited as long as it is subjected to the affixing apparatus 30 in order to affix the film (20) to the main surface 10A. Examples of such a plate-shaped body (10) include a semiconductor wafer, an optical lens, a semiconductor package, and a wafer on which chips are laminated. A semiconductor wafer is preferably used as the plate-shaped body (10).

As the plate-shaped body (10) subjected to the affixing apparatus 30, a plate-shaped body having a notched step portion at a peripheral edge part of the main surface 10A to which the film (20) is affixed is preferable.

That is, the affixing apparatus 30 includes a compression device that includes the pressing member 32 and the support member 33. The compression device is a mechanism that compresses the edge part of the film (20) in its thickness direction. Therefore, the affixing apparatus 30 including the compression device can fill the step of the peripheral edge part of the main surface 10A by compressing and deforming the edge part of the film (20) so as to correspond to the step portion.

As the plate-shaped body (10) having the notched step portion at the peripheral edge part of the main surface 10A described above, the semiconductor wafer 10 having bumps 11 which will be described below is particularly useful.

Note that the material and shape of the semiconductor wafer 10 are not particularly limited. Usually, the semiconductor wafer 10 is formed in a disk shape using silicon as a material.

Further, the entire surface of the semiconductor wafer 10 on the side having the bumps 11 serves as the main surface 10A. That is, the main surface 10A of the semiconductor wafer 10 includes the surface of the semiconductor wafer 10 and the surface of the bumps 11.

In addition, in the semiconductor wafer 10, a surface opposite to the main surface 10A defined as a back surface.

As illustrated in FIGS. 6(a) and 6(b) and FIGS. 7(a) and 7(b), the semiconductor wafer 10 has, on the main surface 10A, a first region 12 in which the bumps 11 are arranged and a second region 13 in which no bumps 11 are arranged.

In the peripheral edge part of the main surface 10A of the semiconductor wafer 10, a notched step portion is formed by the second region 13.

The second region 13 includes a peripheral edge region 13A and a blank region 13B.

The peripheral edge region 13A is a region forming a peripheral edge of the semiconductor wafer 10. In other words, the peripheral edge region 13A is a region forming the peripheral edge of the main surface 10A.

Specifically, a chamfered portion 14 is provided at the peripheral edge of the semiconductor wafer 10 for the purpose of preventing chipping or cracking of the peripheral edge. The peripheral edge region 13A is a region including the chamfered portion 14.

No bumps are arranged in the peripheral edge region 13A including the chamfered portion 14.

The blank region 13B is a region where bumps can be arranged, but no bumps are actually arranged.

Specifically, the blank region 13B is a region obtained by removing the peripheral edge region 13A from the second region 13.

The shape (planar shape) of each region described above is not particularly limited.

Figure 6A:
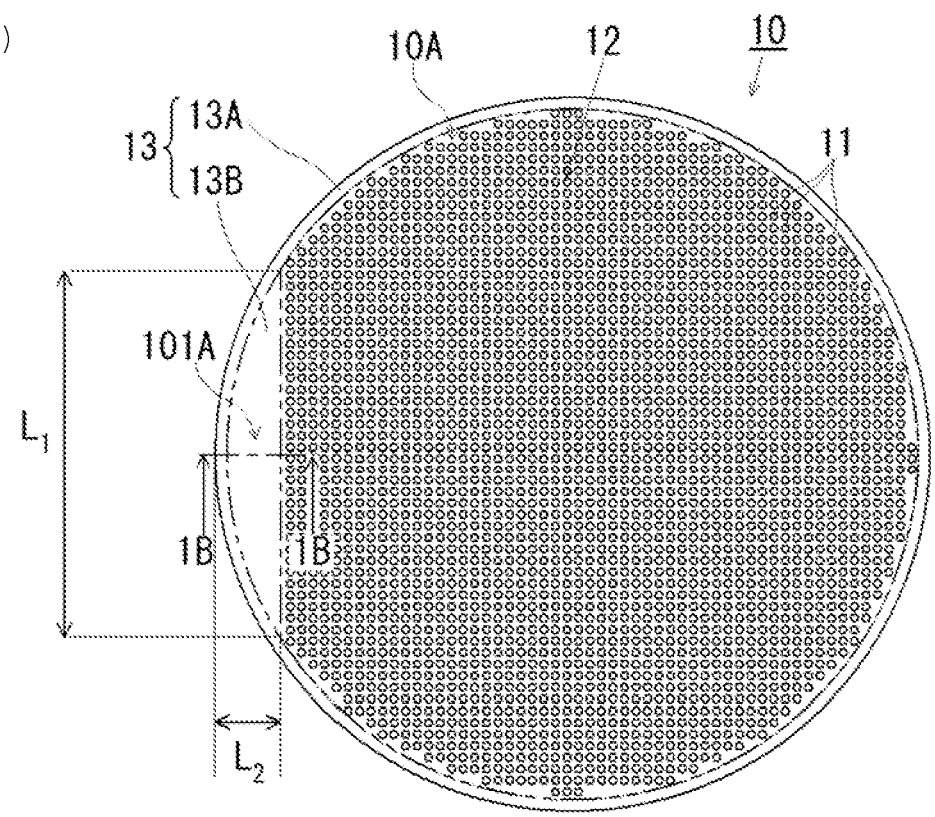
FIG. 6($a$) is a plan view and FIG. 6($b$) is an enlarged cross-sectional view taken along line 1B-1B in FIG. 6($a$), for explaining a semiconductor wafer as a plate-shaped body of the present invention.

As illustrated in FIG. 6(a), the first region 12 can be provided in a substantially circular shape in plan view at a substantially central portion of the main surface 10A.

Figure 7A:
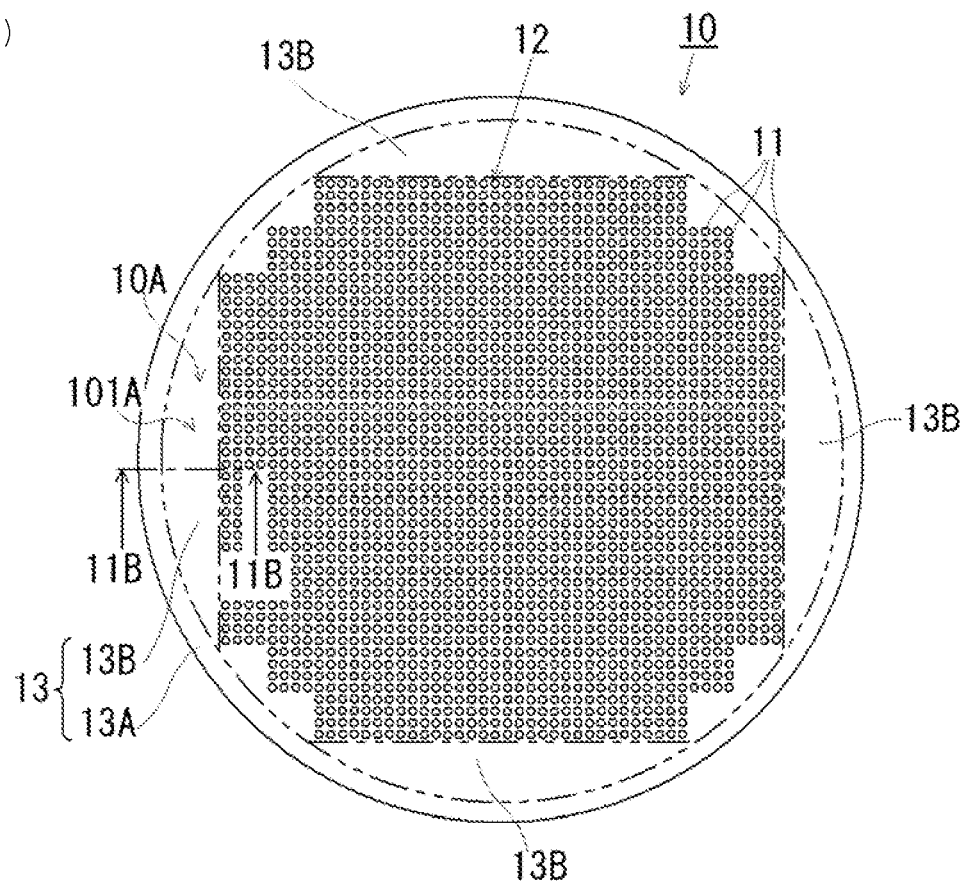
FIG. 7($a$) is a plan view and FIG. 7($b$) is an enlarged cross-sectional view taken along a line 11B-11B in FIG. 7($a$), for explaining a semiconductor wafer as the plate-shaped body of the present invention.

Also, as illustrated in FIG. 7(a), the first region 12 can be provided in a polygonal shape in plan view at a substantially central portion of the main surface 10A.

In order to make the first region 12 and the second region 13 easy to understand, boundary lines of these regions are indicated by two-dot chain lines in FIGS. 6(a) and 7(a).

For example, as illustrated in FIGS. 6(a) and 7(a), the second region 13 can be provided in a shape enclosing the first region 12.

Furthermore, the shape of the peripheral edge region 13A constituting the second region 13 can be, for example, a substantially annular shape in plan view so as to enclose the first region 12 inside (see FIGS. 6 and 7).

The shape (planar shape) of the blank region 13B can be an arch shape as illustrated in FIG. 6(a). That is, the blank region 13B can be provided by expanding the peripheral edge region 13A in an arch shape toward the center of the main surface 10A on the left side portion of the main surface 10A. Such a blank region 13B can be used for the purpose of displaying (for example, an engraved mark or the like) various types of information such as a serial number and a production number of the semiconductor wafer 10. Therefore, the arcuate blank region 13B in FIG. 6(a) can also be referred to as an identification region.

In addition, as exemplified in FIG. 7(a), the shape (planar shape) of the blank region 13B can be a shape enclosing the periphery of the first region 12 from four directions of front, back, left, and right. More specifically, the shape of the blank region 13B can be a shape in which four arc shapes are connected. Such a blank region 13B can be used as a region where no bumps 11 are arranged, for example, because an error is likely to occur at the time of commercialization.

Furthermore, the blank region 13B in FIG. 7(a) can also be referred to as a region formed when the size of the chip cut out from the semiconductor wafer 10 is large. That is, when the size of the chip is small, the first region 12 has a substantially circular shape in the plan view of FIG. 6(a). On the other hand, when the size of the chip is large, the first region 12 has a substantially polygonal shape in the plan view of FIG. 7(a). Then, when the first region 12 has a substantially polygonal shape in plan view, the blank region 13B in FIG. 7(a) is formed so as to enclose the periphery of the first region 12. In a case where the blank region 13B in FIG. 7(a) is formed, the size of the chip is, for example, 100 $mm^2$ or more.

In the following description, the surface of the blank region 13B is referred to as a "blank region surface 101 A".

Figure 6B:
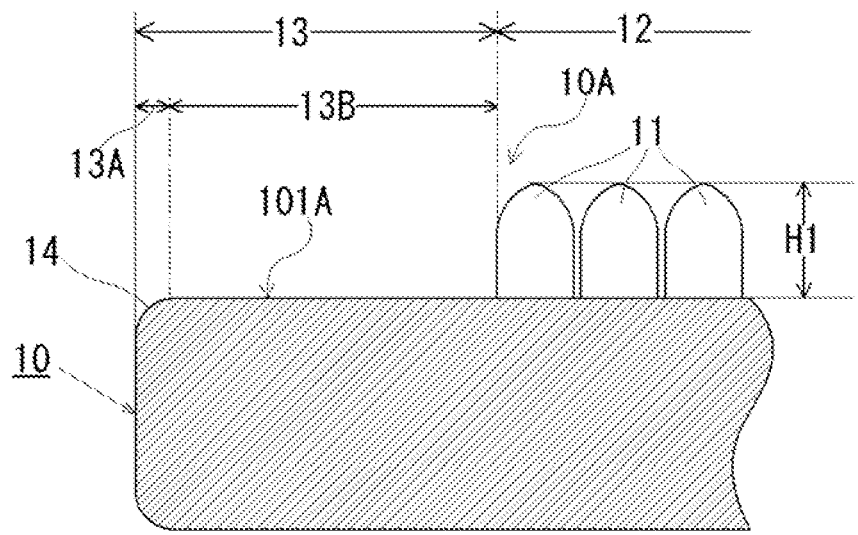
Figure 7B:
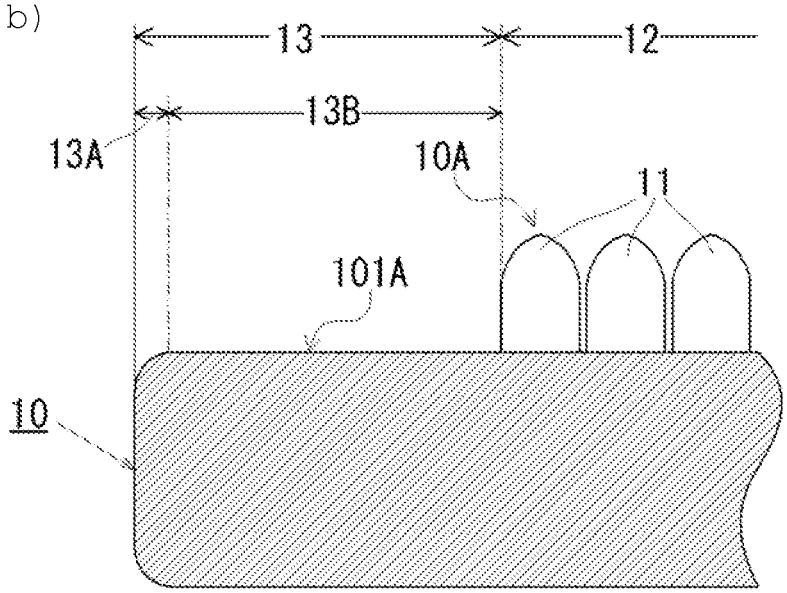

An average height H1 of the bumps 11 on the main surface 10A illustrated in FIGS. 6(b) and 7(b) is not particularly limited. The average height H1 can be arbitrarily set according to the type of the bumps 11 such as plated bumps, ball bumps, or printed bumps. Usually, the average height H1 of the bumps 11 on the main surface 10A is preferably less than 350 µm, more preferably in a range of 5 to 250 µm, still more preferably in a range of 10 to 150 µm.

The ratio of the area of the second region 13 to the total area of the main surface 10A is not particularly limited. This ratio can be arbitrarily set depending on the size of the blank region 13B. For example, this ratio can be preferably less than 30%, more preferably 23% or less, still more preferably 15% or less.

The ratio of the area of the main surface 13A to the total area of the peripheral edge region 10A is not particularly limited. Usually, this ratio is preferably 10% or less, more preferably 8% or less, still more preferably 5% or less.

The ratio of the area of the blank region 13B to the total area of the main surface 10A is not particularly limited. Usually, this ratio can be arbitrarily set, and is preferably 20% or less, more preferably 15% or less, still more preferably 10% or less.

In the second region 13, the peripheral edge region 13A and the blank region 13B both have a notched step portion with respect to the first region 12. A dent, recess, or the like following the step portion is formed on the surface of the film (20), and thus may cause defects such as occurrence of a vacuum error, occurrence of a crack, cracking, or the like.

When the peripheral edge region 13A and the blank region 13B are compared with each other, the blank region 13B is larger than the peripheral edge region 13A in terms of the ratio of the area to the total area of the main surface 10A. Hence, a larger dent, recess, or the like is likely to be formed on the surface of a protective film 20 in the blank region 13B than in the peripheral edge region 13A, and the above-described defect is highly likely to be caused.

Therefore, in the following description, the second region 13 will be described, taking the blank region 13B as an example thereof unless otherwise specified.

(5) Film

The film (20) will be described in detail.

The shape, type, configuration, and the like of the film (20) are not particularly limited as long as the film (20) is subjected to the affixing apparatus 30 so as to be affixed to the main surface 10A of the plate-shaped body (10). Examples of the film (20) include a protective film, a film for manufacturing a semiconductor component such as a dicing film, and a protective film for an optical lens.

The protective film 20 which will be described below is useful as the film (20) when the plate-shaped body (10) is a semiconductor wafer, particularly when the plate-shaped body (10) is the semiconductor wafer 10 having the bumps 11 on the main surface 10A described above.

The protective film 20 is a film used at the time of manufacturing a semiconductor component. More specifically, the protective film 20 is a film used in a back grinding process of grinding the back surface of the semiconductor wafer 10 to a desired thickness at the time of manufacturing a semiconductor component.

Figure 8:
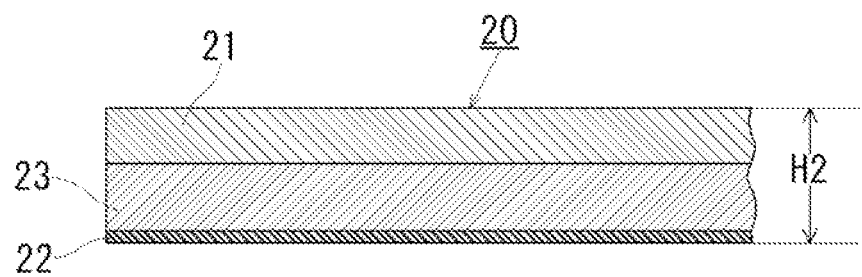
FIG. 8 is an enlarged cross-sectional view for explaining a protective film as a film of the present invention.

As illustrated in FIG. 8, the protective film 20 can include a base layer 21 and an adhesive layer 22.

The base layer 21 is a layer provided for the purpose of improving characteristics such as handleability, mechanical characteristics, and heat resistance of the protective film 20.

The adhesive layer 22 is a layer provided for the purpose of affixing and fixing the protective film 20 to the main surface 10A of the semiconductor wafer 10.

The unevenness absorption layer 23 is a layer having unevenness absorption property exhibited upon exhibition of fluidity or plasticity. The unevenness absorption layer 23 is a layer provided for the purpose of absorbing the unevenness shape by the bumps 11 arranged on the main surface 10A to smooth the surface of the protective film 20.

An average thickness H2 of the protective film 20 preferably satisfies a relational expression of $0.5 \leq H2/H1$ with the average height H1 of the bumps 11.

The upper limit of H2/H1 is not particularly limited, from the viewpoint that the protective film 20 absorbs the unevenness due to the bumps 11 and the step due to the height difference between the first region 12 and the second region 13, by virtue of the amount of thickness, to suitably eliminate the unevenness and the step. The H2/H1 is usually 10 or less ($H2/H1 \leq 10$), preferably 5 or less ($H2/H1 \leq 5$), more preferably 4 or less ($H2/H1 \leq 4$) from the viewpoint of suppressing the loss of the material due to the increase in the average thickness H2 of the protective film 20 and further suitably maintaining the moldability of the protective film 20.

Specifically, the average thickness H2 of the protective film 20 is preferably 30 µm or more, more preferably 100 µm or more, still more preferably 200 µm or more.

Note that the average height H1 is an average value of the actually measured heights of 1/10 bumps randomly selected among the total number of bumps. The average thickness H2 is an average value of the actually measured thicknesses of the film at 10 places selected so as to be distant from each other by 2 cm or more.

Hereinafter, each layer of the protective film will be described.

(5a) Base Layer

The material used for the base layer 21 is not particularly limited as long as it has mechanical strength capable of withstanding an external force applied at the time of grinding the semiconductor wafer in the back grinding process.

Usually, a synthetic resin film is used as a material of the base layer 21.

Examples of the synthetic resin can include one or more thermoplastic resins selected from polyolefins such as polyethylene, polypropylene, poly (4-methyl-1 pentene), and poly (1-butene); polyesters such as polyethylene terephthalate and polybutylene terephthalate; polyamides such as nylon-6, nylon-66, and polymethaxylene adipamide; polyacrylate; polymethacrylate; polyvinyl chloride; polyetherimide; ethylene-vinyl acetate copolymers; polyacrylonitrile; polycarbonate; polystyrene; ionomers; polysulfone; polyethersulfone; polyphenylene ether, and the like.

Among these synthetic resins, one or more selected from polypropylene, polyethylene terephthalate, polyamide, and an ethylene-vinyl acetate copolymer are preferable, and one or more selected from polyethylene terephthalate and an ethylene-vinyl acetate copolymer are more preferable, from the viewpoint of suitably protecting the semiconductor wafer in the back grinding step.

In addition, as an additive, a plasticizer, a softener (mineral oil or the like), a filler (carbonate, sulfate, titanate, silicate, oxide (titanium oxide or magnesium oxide), silica, talc, mica, clay, fiber filler, or the like), an antioxidant, a light stabilizer, an antistatic agent, a lubricant, a colorant, or the like can be added to the synthetic resin. These adhesives may be used singly, or two or more thereof may be used in combination.

As the film described above, any stretched film such as an unstretched film, a uniaxially stretched film, or a biaxially stretched film can be used regardless of whether the film is stretched, but a stretched film is preferable from the viewpoint of improving mechanical strength.

As the film, either a monolayer film or a multilayer film having a plurality of layers can be used.

For the base layer 21, it is preferable to use a surface-treated film from the viewpoint of improving adhesiveness to the unevenness absorption layer 23 and the like. Specific examples of the surface treatment include a corona treatment, a plasma treatment, an undercoat treatment, and a primer coating treatment.

The thickness of the base layer 21 is not particularly limited, but is preferably 10 to 200 µm, more preferably 20 to 150 µm, still more preferably 30 to 100 µm from the viewpoint of obtaining good characteristics.

(5b) Adhesive Layer

The material of the adhesive layer 22 is not particularly limited, but one containing at least an adhesive main agent is used. Examples of the adhesive main agent include a (meth)acrylic adhesive, a silicone-based adhesive, a urethane-based adhesive, and a rubber-based adhesive.

The material of the adhesive layer 22 may contain a crosslinking agent in addition to the adhesive main agent.

As a material of the adhesive layer 22, either an energy ray-curable adhesive that can be cured by energy rays or an energy ray-non-curable adhesive that is not cured by energy rays can be used. Among them, the energy ray-curable adhesive material is preferable as a material of the adhesive layer 22, from the viewpoint that it is cured by energy ray irradiation to reduce the adhesive force so that the protective film 20 can be peeled off from the main surface 10A without adhesive residue.

Regarding the energy ray-curable adhesive material, the type of the energy ray is not particularly limited, and examples thereof include ultraviolet rays, electron beams, and infrared rays.

In addition to the adhesive main agent, the energy ray-curable adhesive material may contain a compound having a carbon-carbon double bond in the molecule and a photopolymerization initiator capable of initiating polymerization of the curable compound in response to energy rays. The curable compound is preferably a monomer, oligomer, or polymer having a carbon-carbon double bond in the molecule and being curable by radical polymerization.

The adhesive force of the adhesive layer 22 is not particularly limited, but it is preferable that the adhesive force thereof to the silicon wafer, as measured in accordance with JIS Z0237 when the adhesive layer 22 is affixed to the surface of the silicon wafer, left standing for 60 minutes, and then peeled off from the surface of the silicon wafer, should be 0.1 to 10 N/25 mm (measured in an environment at a temperature of 23° C. and a relative humidity of 50%), from the viewpoint of being able to suppress adhesive residue on the semiconductor wafer at the time of peeling while ensuring good adhesiveness to the semiconductor wafer. The adhesive force is more preferably 0.2 to 9 N/25 mm, still more preferably 0.3 to 8 N/25 mm.

The thickness of the adhesive layer 22 is not particularly limited, but is preferably 1 to 50 µm, more preferably 2 to 45 µm, still more preferably 3 to 40 µm, from the viewpoint that the adhesive layer 22 can be peeled off without adhesive residue while exhibiting suitable adhesive strength.

(5c) Unevenness Absorption Layer

The material of the unevenness absorption layer 23 is not particularly limited as long as it has unevenness absorption property upon exhibition of fluidity or plasticity.

A thermoplastic resin is usually used as a material of the unevenness absorption layer 23.

Specific examples of the thermoplastic resin include an olefin-based resin, an ethylene-polar monomer copolymer, an ABS resin, a vinyl chloride resin, a vinylidene chloride resin, a (meth)acryl-based resin, a polyamide-based resin, a fluorine-based resin, a polycarbonate-based resin, and a polyester-based resin. Among them, at least one selected from an olefin-based resin and an ethylene-polar monomer copolymer is preferable from the viewpoint of good unevenness absorption property.

Examples of the olefin-based resin include linear low density polyethylene (LLDPE), low density polyethylene, high density polyethylene, polypropylene, an ethylene-α-olefin copolymer containing ethylene and an α-olefin having 3 to 12 carbon atoms, a propylene-α-olefin copolymer containing propylene and an α-olefin having 4 to 12 carbon atoms, an ethylene-cyclic olefin copolymer, and an ethylene-α-olefin-cyclic olefin copolymer.

Examples of the ethylene-polar monomer copolymer include ethylene-unsaturated carboxylic acid ester copolymers such as an ethylene-ethyl (meth)acrylate copolymer, an ethylene-methyl (meth)acrylate copolymer, an ethylene-propyl (meth)acrylate copolymer, and an ethylene-butyl (meth)acrylate copolymer; and ethylene-vinyl ester copolymers such as an ethylene-vinyl acetate copolymer, an ethylene-vinyl propionate copolymer, an ethylene-vinyl butyrate copolymer, and an ethylene-vinyl stearate copolymer.

The thermoplastic resins described above may be used alone, or two or more thereof may be used in combination.

The density of the unevenness absorption layer 23 is not particularly limited, but is preferably 800 to 990 kg/m$^3$, more preferably 830 to 980 kg/m$^3$, still more preferably 850 to 970 kg/m$^3$ from the viewpoint of the balance (rigidity and flexibility) between the flexibility associated with the unevenness absorption property and the rigidity associated with the durability in the back grinding step.

The thickness of the unevenness absorption layer 23 is not particularly limited as long as the unevenness absorption property for the unevenness shape due to the bumps 11 and the step due to the height difference between the first region 12 and the second region 13 can be exhibited, but is preferably 20 μm or more, more preferably 80 μm or more, still more preferably 170 μm or more from the viewpoint that the unevenness absorption property can be suitably exhibited.

A storage elastic modulus G' (60) of the unevenness absorption layer 23 at 60° C. is preferably $0.05 \times 10^6$ to $1.0 \times 10^6$ Pa, more preferably $0.075 \times 10^6$ to $0.5 \times 10^6$ Pa from the viewpoint that the unevenness absorption layer 23 can exhibit suitable unevenness absorption property by heating at the time of bonding the protective film 20.

A storage elastic modulus G' (25) of the unevenness absorption layer 23 at 25° C. is preferably $4.0 \times 10^6$ to $7.0 \times 10^6$ Pa, more preferably $4.5 \times 10^6$ to $6.5 \times 10^6$ Pa from the viewpoint that the unevenness absorption layer 23 can retain its shape and maintain suitable adhesion to the main surface 10A after the protective film 20 is bonded.

An elastic modulus ratio G'(25)/G'(60) between the storage elastic modulus G'(60) and the storage elastic modulus G'(25) of the unevenness absorption layer 23 is preferably G'(60)/G'(25)<0.1, more preferably G'(60)/G'(25)≤0.08, still more preferably G'(60)/G'(25)≤0.05 from the viewpoint that good unevenness absorption property can be exhibited and that good adhesion to the main surface 10A can be maintained.

The storage elastic modulus G' is measured using a dynamic viscoelasticity measuring device (for example, "RMS-800" manufactured by Rheometrics, Inc.) under the conditions of a measurement frequency of 1 Hz and a strain of 0.1 to 3%, G'(25) is measured at 25° C., and the storage elastic modulus G'(60) is measured at 60° C.

(5d) Other Layers

The protective film 20 is not limited to the configuration including the base layer 21, the adhesive layer 22, and the unevenness absorption layer 23 described above, and may be configured to include any other layer between the base layer 21 and the unevenness absorption layer 23 or between the unevenness absorption layer 23 and the adhesive layer 22.

Examples of the other layer include an interface strength improving layer that improves interface strength with the adhesive layer 22, a migration prevention layer that suppresses migration of a low molecular weight component to the adhesive surface of the adhesive layer 22, and an antistatic layer that prevents electrification of the protective film 20. These may be used singly, or two or more thereof may be used in combination.

(6) First Use Form of Affixing Apparatus 30

As a first use form of the affixing apparatus 30, affixing of the film (20) to the plate-shaped body (10) by the affixing apparatus 30 will be described in detail.

In the following description, it is assumed that the plate-shaped body (10) is the semiconductor wafer 10 having the bumps 11 on the main surface 10A.

In the following description, the film (20) is the protective film 20 described above.

The affixing by the affixing apparatus 30 includes an arrangement step (see FIG. 9) by the arrangement device 34 and an affixing step (see FIG. 10) by the affixing device. In addition, this affixing step includes a compression step by the compression device (see FIG. 11).

The semiconductor wafer 10 to which the protective film 20 is affixed by the affixing apparatus 30 has a desired thickness in the back grinding process, is divided into individual pieces, and is subjected to various types of processing to form a semiconductor component. That is, in a case where the plate-shaped body (10) is the semiconductor wafer 10, the affixing apparatus 30 is included in a semiconductor component manufacturing apparatus.

Hereinafter, each step of affixing by the affixing apparatus 30 will be described.

(6a) Arrangement Step

Figure 9:
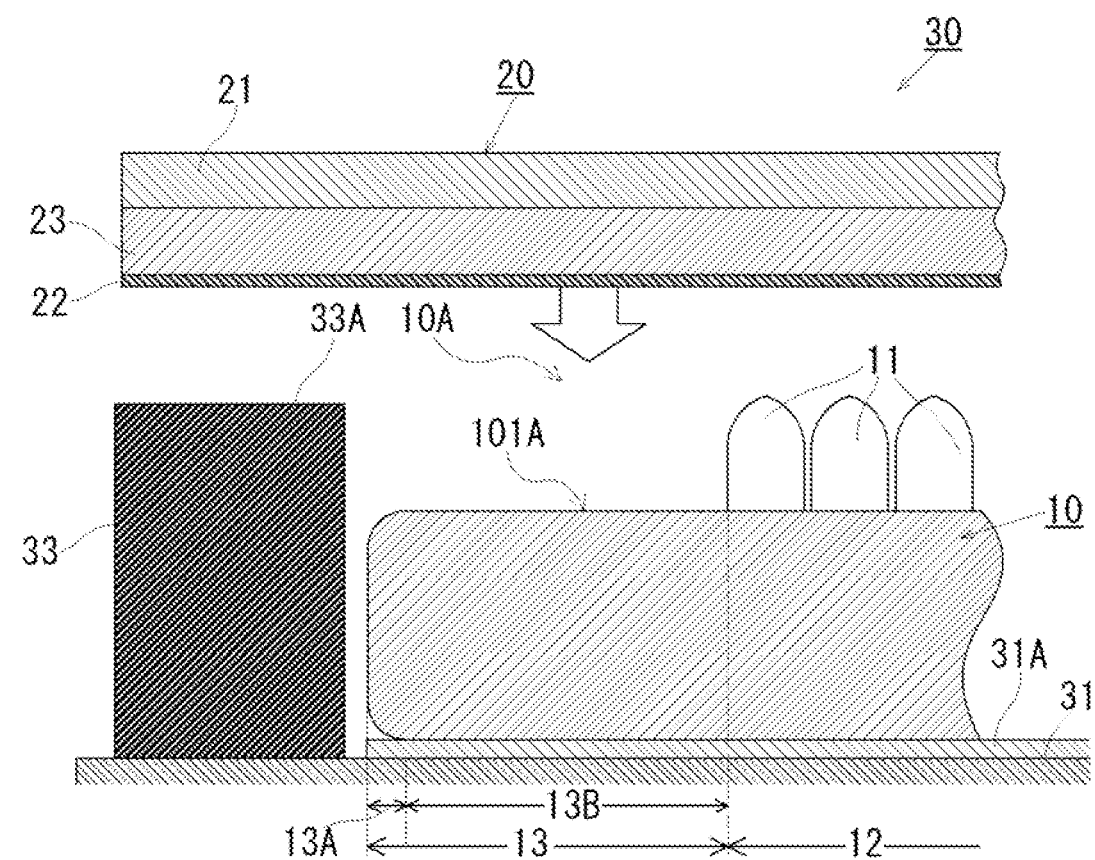
FIG. 9 is an enlarged cross-sectional view for explaining an arrangement step of a first use form in the first invention.

In the arrangement step, as illustrated in FIG. 9, the protective film 20 is supplied onto the main surface 10A of the semiconductor wafer 10.

In this arrangement step, the supplied protective film 20 is arranged so as to cover the main surface 10A of the semiconductor wafer 10.

A method for supplying the protective film 20 by the arrangement device 34 is not particularly limited, and either a batch type in which the protective film 20 is supplied one by one or a continuous type in which the protective film 20 is continuously supplied can be used. The method for supplying the protective film 20 illustrated in FIG. 9 is a batch method.

Further, the protective film 20 can be supplied in a circular shape in plan view corresponding to the main surface 10A by being cut by a cutter (not illustrated) or the like.

In the arrangement step illustrated in FIG. 9, the protective film 20 is arranged such that an edge part (peripheral edge part) of protective film 20 protrudes outward from a peripheral edge of the second region 13 forming a notched step portion at the peripheral edge part of main surface 10A.

The protruding amount of the edge part of the protective film 20 is not particularly limited. From the viewpoint of reliably performing the compression step, the protruding amount is preferably set to an amount which allows the protruding edge part to be placed on the support surface 33A of the support member 33.

Figure 11:
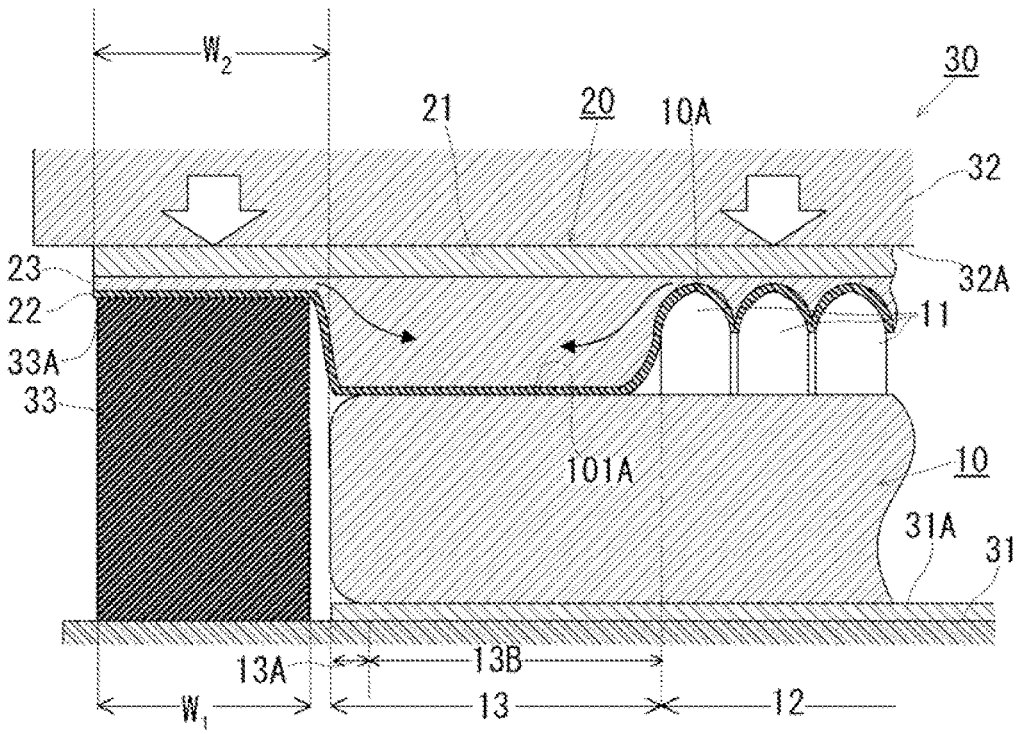
FIG. 11 is an enlarged cross-sectional view for explaining a compression step of the first use form of the first invention.

The protruding amount of the edge part of the protective film 20 preferably has a certain width $W_2$ or more in plan view (see FIG. 11). This is to fill the step of the blank region 13B in a portion of the protective film 20 sandwiched between the pressing member 32 and the support member 33 in the compression step.

The volume required to fill the step is appropriately adjusted according to conditions such as the height of the bumps 11, the area of the blank region 13B occupying the main surface 10A of the semiconductor wafer 10, and the thickness of the protective film 20.

Therefore, with respect to the protruding amount of the edge part of the protective film 20, the width $W_2$ in plan view is not particularly limited. In general, the width $W_2$ of the protruding amount is more preferably an amount which allows the edge part of the protective film 20 not to protrude further outward from the peripheral edge of the support surface 33A.

Specifically, regarding the protruding amount of the edge part of the protective film 20, when the length between the position corresponding to the peripheral edge of the main surface 10A on the protective film 20 and the outer peripheral edge of the protective film 20 is a width $W_2$ in the above plan view, the width $W_2$ is preferably 0.5 to 10 mm, more preferably 1 to 8 mm, still more preferably 1.5 to 6 mm.

(6b) Affixing Step

Figure 10:
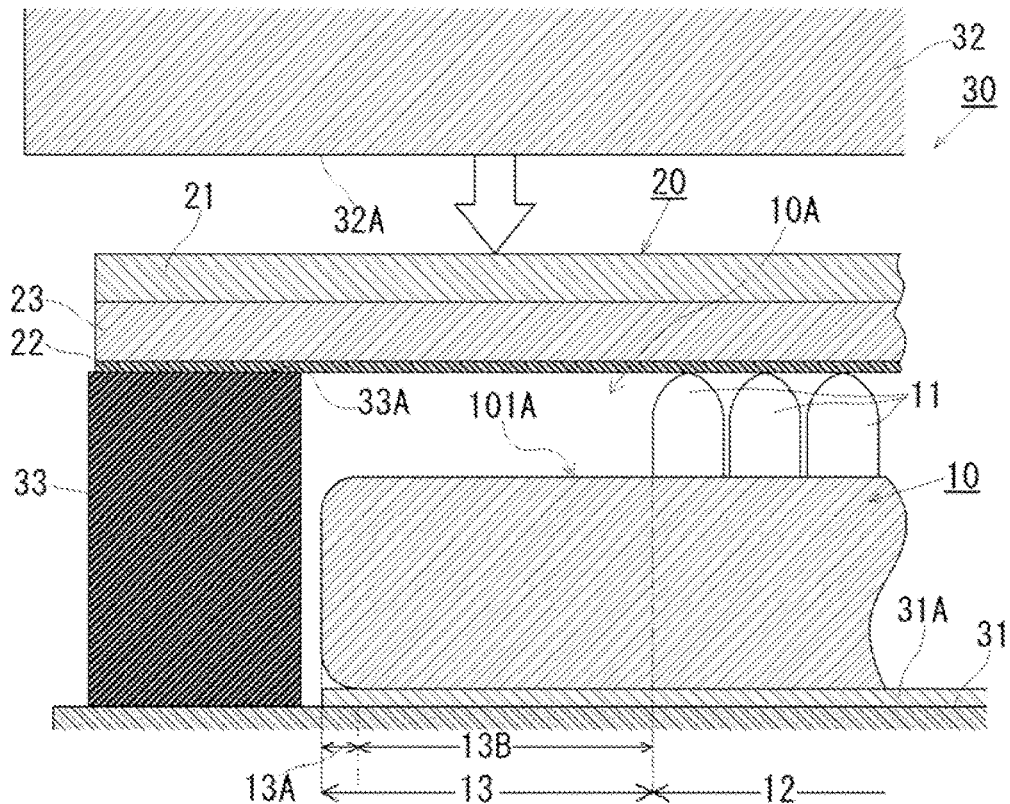
FIG. 10 is an enlarged cross-sectional view for explaining an affixing step of the first use form in the first invention.

In the affixing step, as illustrated in FIG. 10, the pressing member 32 is brought close to the main surface 10A of the semiconductor wafer 10, and the protective film 20 is pressed against the main surface 10A by the pressing member 32 to be affixed.

This affixing step includes the compression step (see FIG. 11).

The execution timing of the compression step in the affixing step is not particularly limited, and, for example, the start time of the compression step may be after the start of the affixing step, the end time of the compression step and the end time of the affixing step may be substantially simultaneous, and the end time of the compression step may be before the end of the affixing step.

In the affixing step, by heating the protective film 20 using the heating device, the thick portion (unevenness absorption layer 23) of the protective film 20 can be suitably deformed in the compression step.

The heating temperature of the protective film 20 is not particularly limited as long as it is set to a temperature at which the unevenness absorption layer 23 can be suitably deformed according to the storage elastic modulus G' of the unevenness absorption layer 23 described above.

Specifically, the heating temperature of the protective film 20 is preferably 50 to 200° C., more preferably 60 to 100° C., still more preferably 70 to 90° C. as long as the storage elastic modulus G' of the unevenness absorption layer 23 is in the range described above.

(6c) Compression Step

In the compression step, the edge part of the protective film 20 arranged so as to protrude outward from the peripheral edge of the second region 13 serving as the step portion on the main surface 10A in the arrangement step is supported by the support member 33 as illustrated in FIG. 11, and compressed by being sandwiched between the support member 33 and the pressing member 32.

The compressive force at the time of compressing the edge part of the protective film 20 can be set by the pressing force by the pressing member 32. The specific pressing force is preferably 0.3 to 2 MPa, more preferably 0.4 to 1.5 MPa, still more preferably 0.5 to 1 MPa from the viewpoint of suitably compressing the edge part of the protective film 20 and preventing cracking and occurrence of cracks of the semiconductor wafer 10.

In the compression step, in the protective film 20 compressed in the thickness direction, a layer exhibiting fluidity or plasticity (unevenness absorption layer 23) appropriately flows according to a step or unevenness, and causes offset of a thick portion that fills the step or the unevenness.

That is, on the first region 12 of the main surface 10A, the thick portion (unevenness absorption layer 23) of the protective film 20 is sandwiched between the pressing member 32 and the bumps 11 and crushed in the thickness direction, and is deformed following the unevenness of the bumps 11 to fill the unevenness. A part of the thick portion of the protective film 20 crushed in the thickness direction flows onto the blank region 13B of the second region 13 as indicated by an arrow on the right side in FIG. 11, so that the amount of thickness of the protective film 20 on the blank region surface 101A is increased.

On the other hand, the edge part of the protective film 20 is compressed between the support member 33 and the pressing member 32. As indicated by an arrow on the left side in FIG. 11, the thick portion (unevenness absorption layer 23) of the edge part of the protective film 20 flows so as to be squeezed out onto the blank region surface 101A. As a result, the amount of thickness of the protective film 20 on the blank region surface 101A increases.

The thick portion flows into the protective film 20 on the blank region surface 101A from the first region 12 and the compressed edge part. Therefore, the protective film 20 is replenished with an amount of thickness sufficient to fill the step over the entire second region 13 serving as the step portion on the main surface 10A. As described above, in the protective film 20 on the blank region surface 101A replenished with the amount of thickness, the step over the entire second region 13 is filled by increasing the thickness.

In addition, since the surface of the protective film 20 is pressed by the pressing member 32, the surface becomes flat following the pressing surface 32A without being affected by the flow of the thick portion.

In addition, in the compression step using the pressing member 32 and the support member 33, the flow of the thick portion of the protective film 20 further outward from the peripheral edge of the main surface 10A is restricted.

That is, the edge part of the protective film 20 compressed in the thickness direction is held between the support member 33 and the pressing member 32. Therefore, the flow of the thick portion further outward from the peripheral edge of the second region 13 is restricted, and the thick portion is maintained on the blank region surface 101A.

Then, as described above, the thick portion (unevenness absorption layer 23) of the protective film 20 is thickly offset on the second region 13 of the main surface 10A, whereby the step on the main surface 10A is filled, and the surface of the protective film 20 becomes flat.

Figure 12:
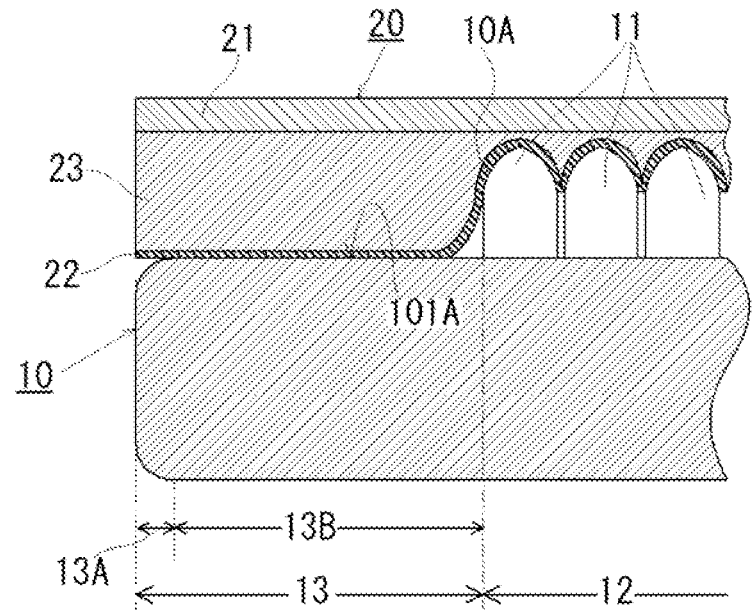
FIG. 12 is an enlarged cross-sectional view for explaining a semiconductor wafer to which a protective film is affixed by the affixing apparatus of the first invention.

After the compression step, the semiconductor wafer 10 having the protective film 20 affixed to the main surface 10A is taken out from the affixing apparatus 30, and a surplus portion such as an edge part of the compressed protective film 20 is cut off. In the semiconductor wafer 10, as illustrated in FIG. 12, the thick portion of the protective film 20 is thickly offset on the blank region surface 101A to fill the step.

In the above description, explanation has been made, taking the blank region 13B as an example of the second region 13. However, similarly as in the blank region 13B, the thick portion of the protective film 20 is thickly offset on the second region 13 to fill the step, in the peripheral edge region 13A.

The surface of the protective film 20 affixed to the semiconductor wafer 10 becomes a uniform flat surface as a whole without forming a defect following the step of the semiconductor wafer 10.

Figure 13:
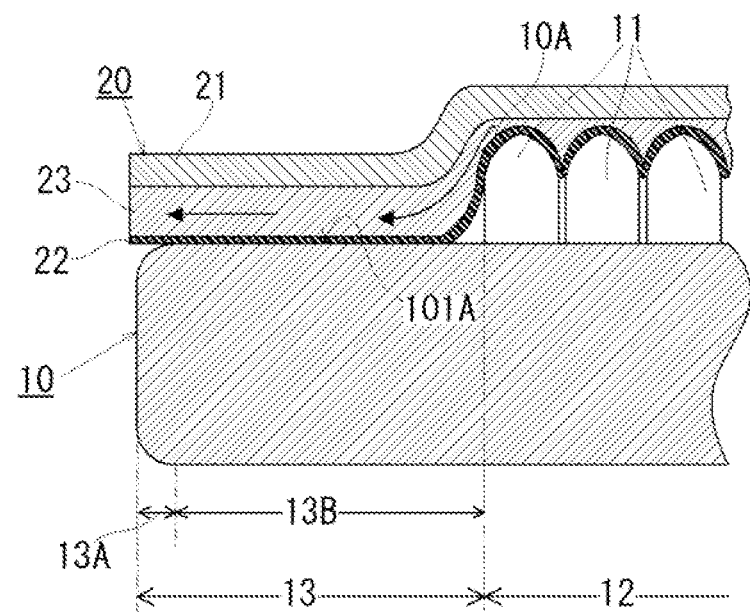
FIG. 13 is an enlarged cross-sectional view for explaining a semiconductor wafer to which a protective film is affixed by a normal affixing apparatus.

Note that FIG. 13 is an explanatory view of a case where the protective film 20 is affixed to the semiconductor wafer 10 having the above step on the main surface 10A by an affixing apparatus not including the compression device (support member 33).

The protective film 20 has a resin volume amount (hereinafter, also referred to as "amount of thickness") at least sufficient for the unevenness absorption layer 23 to absorb the unevenness due to the bumps 11 in the first region 12, but the amount of thickness is insufficient to fill the step between the first region 12 and the second region 13, and the step cannot be filled.

In particular, the second region 13 has a large size (area occupying the main surface 10A), and the amount of thickness of the protective film 20 is significantly insufficient to fill the step over the entire second region 13.

In addition, as indicated by an arrow in FIG. 13, the thick portion (unevenness absorption layer 23) of the protective film 20 flows so as to escape further outward from the peripheral edge of the main surface 10A of the semiconductor wafer 10. The affixing apparatus that does not include the compression device (support member 33) does not include a unit that restricts the flow of the thick portion.

(7) Second Use Form of Affixing Apparatus 30

A second use form of the affixing apparatus 30 will be described. In the second use form, an affixing apparatus 30 having the same configuration as that of the first use form is used.

Figure 14A:
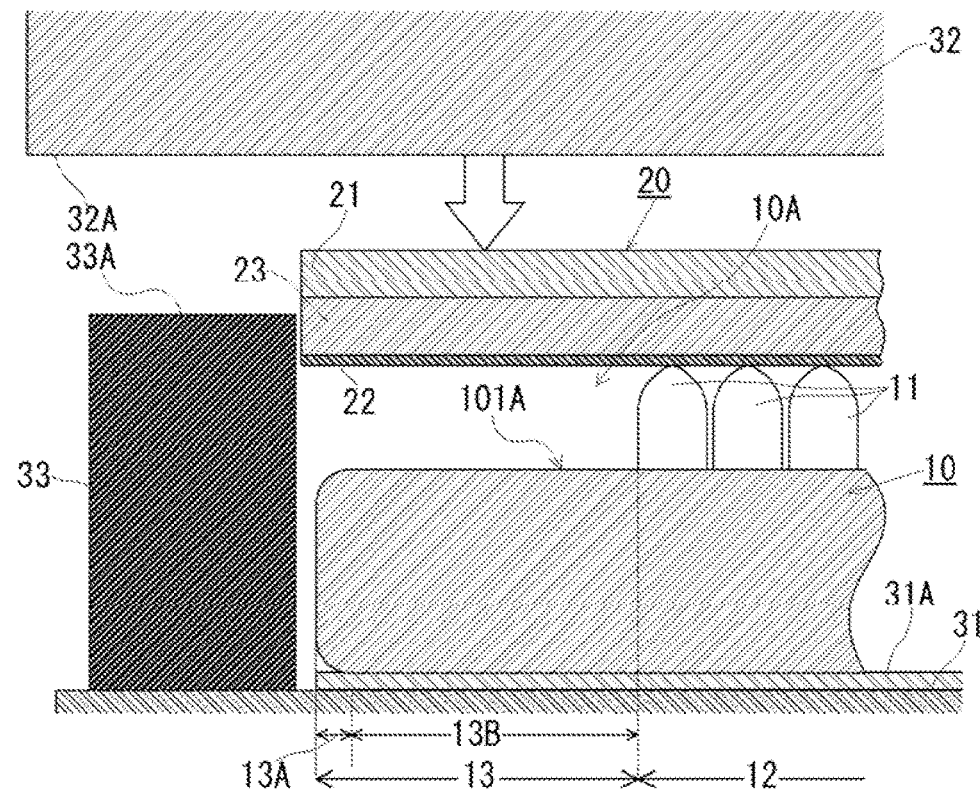
FIG. 14($a$) is an enlarged cross-sectional view for explaining an arrangement step and FIG. 14($b$) is an enlarged cross-sectional view for explaining a compression step, according to a second use form of the first invention.
Figure 14B:
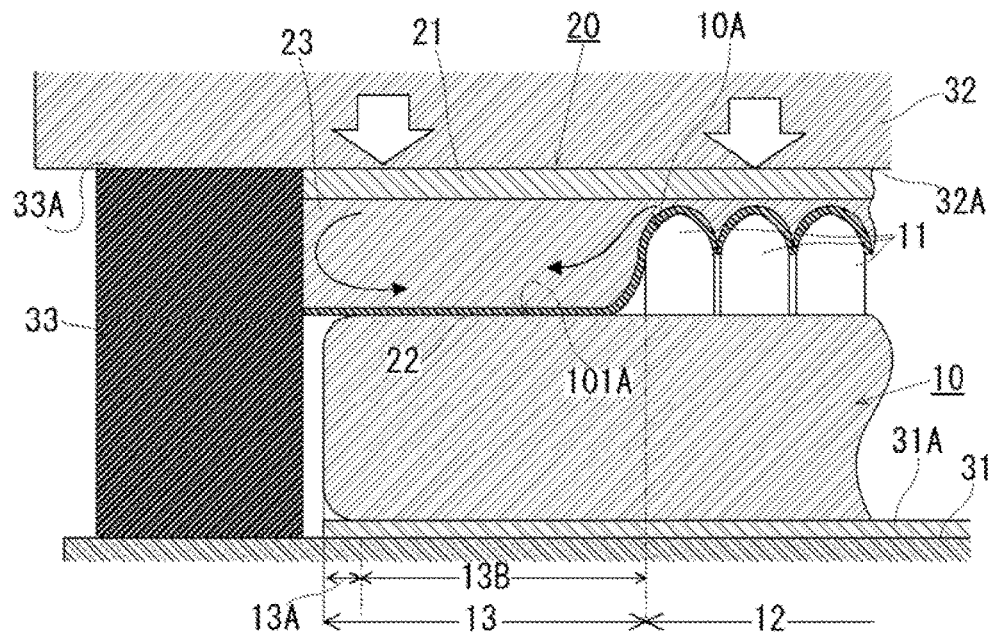

The affixing by the affixing apparatus 30 in the second use form includes an arrangement step (see FIG. 14(*a*)) by the arrangement device 34 and an affixing step (see FIG. 10) by the affixing device. In addition, this affixing step includes a compression step by the compression device (see FIG. 14(*b*)).

The second use form is different from the first use form described in (6) in the arrangement step and the compression step.

In the following description, it is assumed that the plate-shaped body (10) is the semiconductor wafer 10 having the bumps 11 on the main surface 10A.

In the following description, the film (20) is the protective film 20 described above.

The semiconductor wafer 10 to which the protective film 20 is affixed by the affixing apparatus 30 has a desired thickness in the back grinding process, is divided into individual pieces, and is subjected to various types of processing to form a semiconductor component. That is, in a case where the plate-shaped body (10) is the semiconductor wafer 10, the affixing apparatus 30 is included in a semiconductor component manufacturing apparatus.

(7a) Arrangement Step

In the arrangement step of the second use form, as illustrated in FIG. 14(*a*), the protective film 20 is arranged such that the edge part (peripheral edge part) of the protective film 20 is positioned on the inner peripheral side of the support member 33.

That is, in this arrangement step, the edge part of the protective film 20 is not placed on the support surface 33A of the support member 33.

In the arrangement step, in order to block the bulging of the protective film 20 in an outer peripheral direction of the second region 13 generated in the compression step by the inner peripheral surface of the support member 33, it is desirable to shorten the distance between the edge part of the protective film 20 and the inner peripheral surface of the support member 33 in plan view as much as possible.

Specifically, the distance between the edge part of the protective film 20 and the inner peripheral surface of the support member 33 in plan view is preferably less than 1 mm, more preferably 0.5 mm or less, still more preferably 0.3 mm or less. Most preferably, the distance between the edge part of the protective film 20 and the inner peripheral surface of the support member 33 in plan view is 0 mm, that is, the edge part of the protective film 20 is in contact with the inner peripheral surface of the support member 33.

(7b) Affixing Step

In the affixing step of the second use form, the protective film 20 is affixed to the main surface 10A of the semiconductor wafer 10 using the pressing member 32 in the same manner as in the affixing step of the first use form (see FIG. 10). This affixing step includes the compression step (see FIG. 14(*b*)).

The details of this affixing step are the same as those of the affixing step of the first use form, and the description thereof will be omitted below.

(7c) Compression Step

In the compression step of the second use form, the protective film 20 sandwiched between the pressing member 32 and the main surface 10A tries to bulge the thick portion (unevenness absorption layer 23) from its edge part (peripheral edge part) in the outer peripheral direction of the second region 13 serving as the step portion on the main surface 10A. The bulging of the thick portion (unevenness absorption layer 23) is blocked by the inner peripheral surface of the support member 33 as indicated by an arrow on the left side in FIG. 14(*b*).

In the edge part of the protective film 20, the thick portion (unevenness absorption layer 23) blocked by the inner peripheral surface of the support member 33 remains on the blank region surface 101A, and the thick portion flows from the first region 12 onto the blank region surface 101A, so that the entire second region 13 serving as the step portion on the main surface 10A is replenished with the amount of thickness sufficient to fill the step.

The thickness of the edge part of the protective film 20 on the blank region surface 101A is increased by the edge part being replenished with the amount of thickness. Therefore, the compression step is a step of compressing the edge part of the protective film 20 by the pressing surface 32A of the pressing member 32, the inner peripheral surface of the support member 33, and the main surface 10A of the semiconductor wafer 10. Over the entire second region 13, the step is filled with the edge part of the compressed protective film 20.

When the first use form is compared with the second use form, the edge part of the protective film 20 is compressed and crushed between the support member 33 and the pressing member 32 in the first use form. On the other hand, the second use form is different in that the bulging of the protective film 20 is blocked by the inner peripheral surface of the support member 33 without compressing the edge part of the protective film 20 between the support member 33 and the pressing member 32.

When the protective film 20 has a layer capable of exhibiting fluidity or plasticity, that is, the unevenness absorption layer 23, the effects obtained by the above difference can be more remarkably produced.

That is, when the protective film 20 has a layer (unevenness absorption layer 23) capable of exhibiting fluidity or plasticity and the first use form is implemented, the layer (unevenness absorption layer 23) constituting the edge part is caused to flow and extruded to the second region 13 of the main surface 10A, so that not only the portion extruded from the first region 12 but also the portion extruded from the outer edge part of the second region 13 can be used to replenish the amount of thickness.

In other words, briefly, in the first use form, the unevenness absorption layer 23 of the protective film 20 is pushed out from both the inner peripheral edge part and the outer peripheral edge part of the peripheral edge part enclosing the second region 13 to this second region 13 to fill the step.

On the other hand, when the protective film 20 has a layer (unevenness absorption layer 23) capable of exhibiting fluidity or plasticity and the second use form is implemented, the layer (unevenness absorption layer 23) constituting the edge part cannot be caused to flow or extruded to the second region 13 of the main surface 10A, and it is necessary to replenish the amount of thickness only with the portion extruded from the first region 12.

In other words, briefly, in the second use form, the unevenness absorption layer 23 of the protective film 20 is pushed out from only the inner peripheral edge part of the peripheral edge part enclosing the second region 13 to this second region 13 to fill the step.

Therefore, when the protective film 20 has a layer (unevenness absorption layer 23) capable of exhibiting fluidity or plasticity, the first use form can also correspond to the semiconductor wafer 10 having a larger blank region 13B and can be said to be more advantageous than the second use form, in that the layer (unevenness absorption layer 23) constituting the edge part outside the second region 13 can be used to fill the step of the second region 13.

[2] Affixing Apparatus (Second Invention)

In an affixing apparatus of a second invention, a film (20) is affixed to a plate-shaped body (10).

The plate-shaped body (10) has a step on the main surface 10A to which the film (20) is affixed.

The affixing apparatus includes a mounting member 31 and a pressing member (32), and also includes an arrangement device (34) and a processing device (40).

The mounting member 31 has a plate shape. The mounting member 31 is provided with a mounting portion 31A on which the plate-shaped body (10) is mounted (see FIGS. 16 to 18).

The pressing member (32) has a plate shape. The pressing member (32) is installed at a position facing the mounting member 31 (see FIGS. 16 to 18).

The arrangement device (34) is a mechanism that arranges the film (20) on the main surface 10A. The arrangement device (34) is installed between the mounting member 31 and the pressing member 32 (see FIG. 1).

The processing device 40 is a mechanism that forms a site having a relatively large thickness on the film (20) arranged on the main surface 10A such that it corresponds to the step of the main surface 10A (see FIGS. 15 and 18).

The plate-shaped body (10) is the same as that of the first invention, and the detailed description thereof will be omitted. Further, the film (20) is the same as that of the first invention, and the detailed description thereof will be omitted.

(1) First Form

A first form of the affixing apparatus of the second invention specifically includes a mounting member 31, a pressing member 32, an arrangement device 34, and, further, a processing device 40.

Here, the mounting member 31, the pressing member 32, and the arrangement device 34 that are substantially the same as those of the affixing apparatus 30 of the first invention can be used, and the detailed description thereof will be omitted.

In addition, the processing device 40 may be incorporated in the affixing apparatus 30 or may be installed outside the affixing apparatus 30. That is, whether or not the processing device 40 is integrated with the affixing apparatus 30 is not particularly limited.

(1a) Processing Device

The configuration and the like of the processing device 40 are not particularly limited as long as the processing device has a configuration capable of forming a site having a relatively large thickness on the film (20) such that it corresponds to the step on the main surface 10A.

Figure 15A:
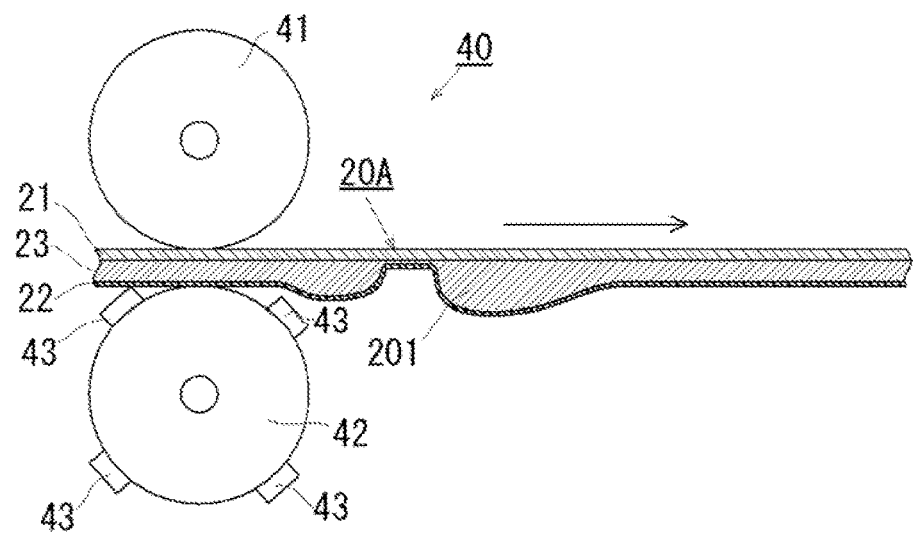
FIG. 15($a$) is a cross-sectional view and FIG. 15($b$) is an enlarged cross-sectional view for explaining a processing device, according to a first form of an affixing apparatus of a second invention.
Figure 15B:
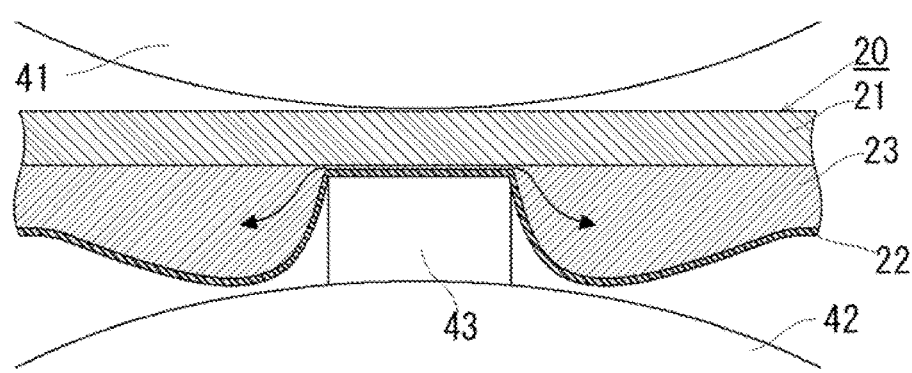

As the processing device 40, a mechanism having the configuration illustrated in FIGS. 15(a) and 15(b) can be exemplified.

Specifically, the processing device 40 includes a first roller 41 and a second roller 42.

The first roller 41 is rotatably supported above the film (20).

The second roller 42 is rotatably supported below the film (20).

The first roller 41 and the second roller 42 are arranged so as to face each other with the film (20) interposed therebetween.

On the peripheral surface of the second roller 42, a plurality of protrusions 43 are provided to protrude.

The materials, driving methods, configurations, and the like of the first roller 41, the second roller 42, and the protrusion 43 are not particularly limited as long as the film (20) can be processed.

(2) Affixing According to First Form

In the affixing apparatus of the second invention, affixing of the film (20) to the plate-shaped body (10) according to the first form will be described in detail.

In the following description, it is assumed that the plate-shaped body (10) is the semiconductor wafer 10 having the bumps 11 on the main surface 10A.

In the following description, the film (20) is the protective film 20 described above.

The affixing according to the first form includes a processing step (see FIG. 15) by the processing device 40, an arrangement step (see FIG. 16) by the arrangement device 34 of the affixing apparatus 30, and an affixing step (see FIG. 17) by the affixing device (the mounting member 31 and the pressing member 32) of the affixing apparatus 30.

The semiconductor wafer 10 to which the protective film 20 is affixed by the affixing apparatus of the first form has a desired thickness in the back grinding process, is divided into individual pieces, and is subjected to various types of processing to form a semiconductor component. That is, in a case where the plate-shaped body (10) is the semiconductor wafer 10, the affixing apparatus is included in a semiconductor component manufacturing apparatus.

Hereinafter, each step of affixing according to the first form will be described.

(2a) Processing step In the processing step, as illustrated in FIG. 15(*a*), the protective film 20 is supplied between the first roller 41 and the second roller 42 of the processing device 40, and the protective film 20 is sent out from between the first roller 41 and the second roller 42 in a traveling direction indicated by an arrow in FIG. 15(*a*).

In the processing device 40, the protective film 20 rotates each of the first roller 41 and the second roller 42 when being sandwiched between the first roller 41 and the second roller 42 and sent out in the traveling direction.

The second roller 42 has a protrusion 43 formed on a peripheral surface thereof, and, as illustrated in FIG. 15(*b*), the protrusion 43 is brought into contact with the protective film 20 as the second roller rotates. Then, the site of the protective film 20 in contact with the protrusion 43 is crushed in the thickness direction between this protrusion 43 and the first roller 41.

As indicated by an arrow in FIG. 15(*b*), the thick portion (unevenness absorption layer 23) at the crushed site of the protective film 20 flows to a site adjacent to the crushed site and is offset. For this reason, the site adjacent to the crushed site has an increased amount of thickness.

In the protective film 20, sites different in thicknesses are formed such that the crushed site is thin and the site adjacent to the crushed site is thick, whereby a processed film 20A is obtained.

The processed film 20A has a region 201 having a relatively large thickness among the sites different in thickness.

(2b) Arrangement Step

Figure 16:
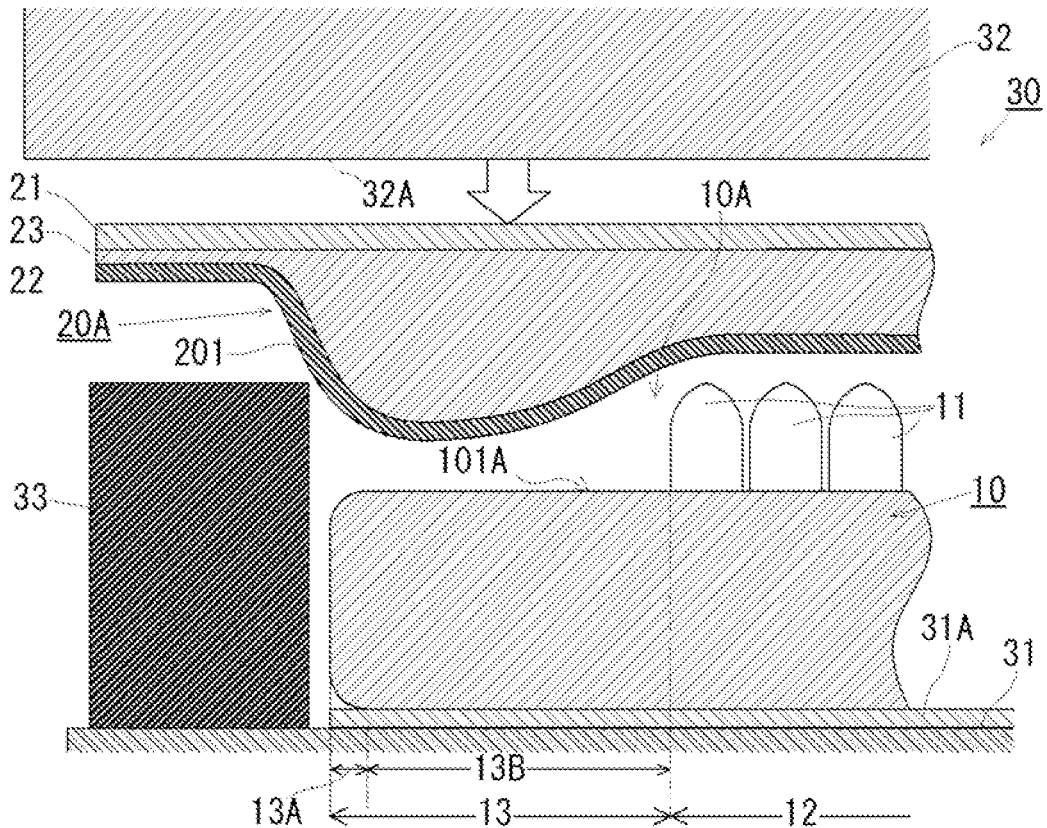
FIG. 16 is an enlarged cross-sectional view for explaining an arrangement step according to the first form of the affixing apparatus of the second invention.

In the arrangement step, as illustrated in FIG. 16, the pressing member 32 is separated from the semiconductor wafer 10 fixed to the mounting portion 31A of the mounting member 31, and then the processed film 20A obtained in the processing step is supplied onto the main surface 10A of the semiconductor wafer 10.

At this time, the processed film 20A is arranged such that the region 201 having a relatively large thickness corresponds to the second region 13 forming the step portion at the peripheral edge part of the main surface 10A, whereby the region 201 is positioned above the blank region surface 101A.

Note that, although not particularly illustrated, the arrangement device 34 can adjust the position of the processed film 20A by appropriately rotating or stopping a traction roller 35B such that the region 201 where the thickness of the processed film 20A is relatively thick corresponds to the second region 13 serving as the step portion on the main surface 10A.

In addition, beside the semiconductor wafer 10, a support member 33 is installed along the outer peripheral edge of the second region 13.

(2c) Affixing Step

Figure 17:
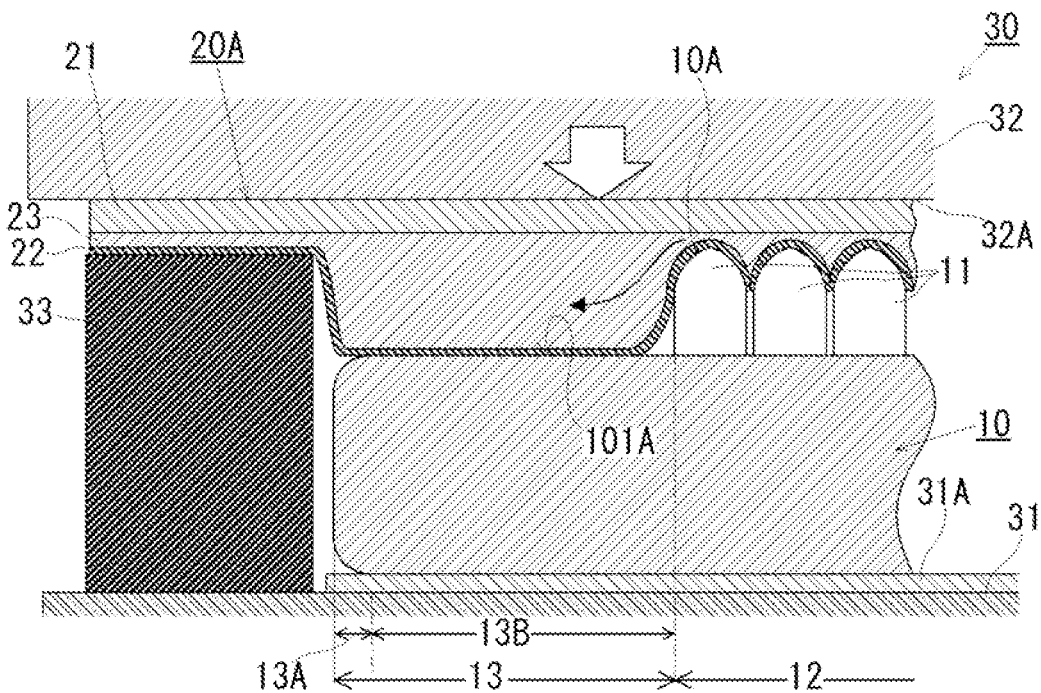
FIG. 17 is an enlarged cross-sectional view for explaining an affixing step according to the first form of the affixing apparatus of the second invention.

In the affixing step, as illustrated in FIG. 17, the edge part of the protective film 20 is supported by the support member 33, the pressing member 32 is brought close to the main surface 10A of the semiconductor wafer 10, and the protective film 20 is pressed against the main surface 10A by the pressing member 32.

In the affixing step, on the first region 12 of the main surface 10A, the thick portion (unevenness absorption layer 23) of the processed film 20A sandwiched between the pressing member 32 and the bump 11 and crushed in the thickness direction is deformed following the unevenness of the bumps 11 to fill the unevenness.

In the affixing step, the edge part of the protective film 20 is sandwiched between the support member 33 and the pressing member 32. Therefore, the flow of the thick portion from above the blank region surface 101A to the edge part of the protective film 20 is restricted.

As indicated by an arrow in FIG. 17, a part of the thick portion of the processed film 20A crushed in the thickness direction flows onto the blank region 13B of the second region 13 serving as the step portion on the main surface 10A, and the amount of thickness of the processed film 20A on the blank region surface 101A is increased.

In the processed film 20A, the region 201 having a relatively large thickness is arranged on the blank region surface 101A (see FIG. 16). By adding the amount of thickness of the thick portion flowing from above the first region 12 to the amount of thickness of the region 201, the amount of thickness of the processed film 20A on the blank region surface 101A further increases (see FIG. 17).

In the processed film 20A, the site adjacent to the region 201 having a relatively large thickness is crushed and thinned in the processing step described above. For this reason, the thick portion is suppressed from escaping further outward from the peripheral edge of the second region 13 through the crushed and thinned site.

The site crushed and thinned in the processing step is sandwiched between the support member 33 and the pressing member 32, and this also prevents the thick portion from escaping further outward from the peripheral edge of the second region 13.

In the affixing according to the first form, the protective film 20 is processed in the processing step to obtain the processed film 20A having the region 201 having a relatively large thickness. The region 201 of the processed film 20A is arranged so as to correspond to the second region 13 of the main surface 10A in the arrangement step. Then, in the affixing step, the thick portion further flows from above the first region 12, so that the entire second region 13 is replenished with a sufficient amount of thickness to fill the step.

As described above, the processed film 20A replenished with the amount of thickness on the blank region surface 101A fills the step over the entire second region 13 by increasing the thickness.

In addition, since the surface of the processed film 20A is pressed by the pressing member 32, the surface becomes flat following the pressing surface 32A without being affected by the flow of the thick portion.

In the above description, explanation has been made, taking the blank region 13B as an example of the second region 13. However, similarly as in the blank region 13B, the thick portion of the processed film 20A is thickly offset on the second region 13 to fill the step, in the peripheral edge region 13A.

Further, the blank region 13B is not limited to the one mainly used as the identification region as illustrated in FIGS. 6(*a*) and 6(*b*), and the same effects can be obtained also in the blank region 13B as illustrated in FIGS. 7(*a*) and 7(*b*).

That is, the first form of the affixing apparatus of the second invention is particularly useful in the case where the plate-shaped body (10) is the semiconductor wafer 10 in which the blank region 13B having the flat blank region surface 101A exists in the second region 13 which is a region where no bumps are arranged.

The surface of the protective film 20 affixed to the semiconductor wafer 10 becomes a uniform flat surface as a whole without forming a defect following the step of the semiconductor wafer 10.

(3) Second Form

An affixing apparatus 30 according to a second form of the second invention includes a mounting member 31, a pressing member 32, and, further, an arrangement device and a processing device.

Figure 18A:
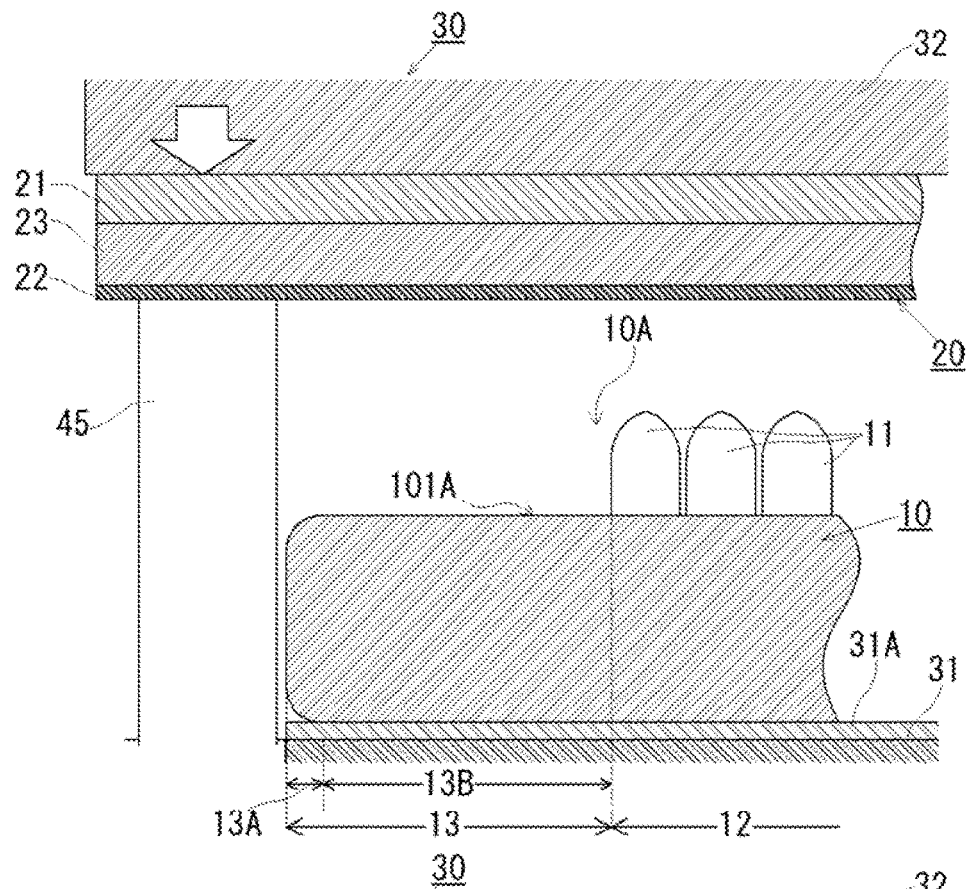
FIG. 18($a$) is an enlarged cross-sectional view for explaining a processing step and FIG. 18($b$) is an enlarged cross-sectional view for explaining an arrangement step, according to a second form of the affixing apparatus of the second invention.
Figure 18B:
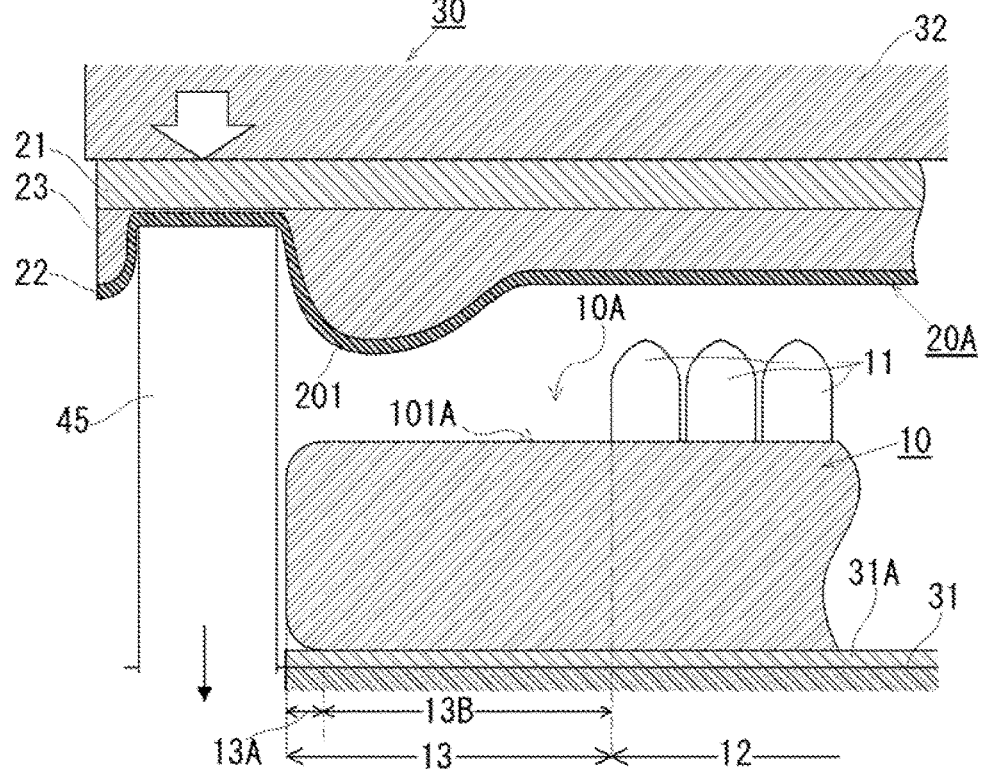

Specifically, as illustrated in FIGS. 18(a) and 18(b), the affixing apparatus 30 includes the mounting member 31, the pressing member 32, and a support column 45 as the arrangement device and the processing device.

As the mounting member 31 and the pressing member 32, the same members as those described above can be used, and the detailed descriptions of the respective members will be omitted.

(3a) Support Column

The affixing apparatus 30 of the second form has a support column 45.

The support column 45 is installed at an outer edge of the mounting portion 31A so as to rise toward the pressing member 32.

The film (20) is arranged such that its edge part (peripheral edge part) is positioned between the support column 45 and the pressing member 32. The support column 45 supports the edge part (peripheral edge part) of the film (20) from below. The support column 45 has a function of crushing the edge part (peripheral edge part) of the film (20) by being sandwiched between itself and the pressing member 32.

Further, the support column 45 is configured such that it can be raised and lowered with respect to the mounting member 31. The support column 45 separates the film (20) from the main surface 10A of the plate-shaped body (10) in a state of being raised from the mounting member 31. The support column 45 has a function of arranging the film (20) on the main surface 10A of the plate-shaped body (10) by being lowered to the mounting member 31 from this state.

That is, the support column 45 has a function as a processing device for processing the film (20) and a function as an arrangement device for arranging the film (20) on the main surface 10A.

The material, driving method, and the like of the support column 45 are not particularly limited as long as the film (20) can be processed as described above.

(4) Affixing According to Second Form

The affixing of the film (20) to the plate-shaped body (10) by the affixing apparatus 30 according to the second form will be described in detail.

In the following description, it is assumed that the plate-shaped body (10) is the semiconductor wafer 10 having the bumps 11 on the main surface 10A.

In the following description, the film (20) is the protective film 20 described above.

The affixing by the affixing apparatus 30 of the second form includes a processing step (see FIG. 18(a)) by the support column 45 as the processing device, an arrangement step (see FIG. 18(b)) by the support column 45 as the arrangement device, and an affixing step (not illustrated) by the affixing device of the affixing apparatus 30.

The semiconductor wafer 10 to which the protective film 20 is affixed by the affixing apparatus has a desired thickness in the back grinding process, is divided into individual pieces, and is subjected to various types of processing to form a semiconductor component. That is, the affixing apparatus is included in a semiconductor component manufacturing apparatus.

Hereinafter, each step of affixing according to the second form will be described.

(4a) Processing Step

In the processing step, as illustrated in FIG. 18(a), when the pressing member 32 lowers, the edge part of the protective film 20 supported by the support column 45 is sandwiched between the pressing member 32 and the support column 45 and crushed in the thickness direction.

As illustrated in FIG. 18(b), the thick portion (unevenness absorption layer 23) at the crushed portion of the protective film 20 flows to the site adjacent to the crushed site and is offset, so that the amount of thickness at the adjacent site is increased.

In the protective film 20, sites different in thicknesses are formed such that the crushed site is thin and the site adjacent to the crushed site is thick, and a processed film 20A is obtained. The processed film 20A has the region 201 having a relatively large thickness among the sites different in thickness.

(4b) Arrangement Step

In the arrangement step, as illustrated in FIG. 18(b), the support column 45 is lowered to the mounting member 31, whereby the protective film 20 is arranged on the main surface 10A.

In processed film 20A, the position of region 201 having a relatively large thickness can correspond to the second region 13 forming the step portion at the peripheral edge part of the main surface 10A.

That is, the support column 45 is installed at the outer edge of the mounting portion 31A. Therefore, when the semiconductor wafer 10 is placed on the mounting portion 31A, the position of the region 13 can be made to correspond to the position of the second region 13 by aligning the support column 45 and the second region 201.

(4c) Affixing Step

In the affixing step, the support column 45 is lowered to the mounting member 31, the protective film 20 is arranged on the main surface 10A, and then the pressing member 32 is lowered.

In the pressing member 32, the protective film 20 is affixed to the main surface 10A by pressing the protective film 20 against the main surface 10A.

EXAMPLES

Hereinafter, the present invention will be described in more detail by way of examples.

[1] Protective Film

As the protective film 20, a film pasted to a 12-inch ring frame was used.

The configuration of the protective film 20, the base layer 21, the adhesive layer 22, and the unevenness absorption layer 23 are as follows.

Base layer 21: material: polyethylene terephthalate film; thickness: 75 μm.

Adhesive layer 22: material: UV curable acrylic adhesive; thickness: 10 μm.

Unevenness absorption layer 23: material: thermoplastic ethylene-α-olefin copolymer (density: 0.861 g/cm$^3$, G'(25): 5.15 MPa, G'(60): 0.14 MPa, melt flow rate (190° C.): 2.9 g/10 min); thickness: 510 μm.

[2] Semiconductor Wafer

As the semiconductor wafer 10 provided with the bumps 11, one having the following specifications was used.

Diameter: 300 mm.
Thickness: 810 μm.
Material: silicon.
Average height of the bumps 11: 200 μm.
Pitch of the bumps 11: 400 μm.
Non-bump region (peripheral edge region 13A): 3 mm from the outer periphery.
Non-bump region (blank region 13B as identification region): length $L_1$ in FIG. 6(a): 90 mm; length $L_2$ in FIG. 6(a): 7 mm.

[3] Affixing of Protective Film

Example 1

The support member 33 (thickness: 1 mm, width $W_1$: 5 mm) formed in an annular shape in plan view was mounted at an outer edge of the mounting portion 31A on the mounting member 31 using the affixing apparatus 30 illustrated in FIG. 1, and the pressing surface 32A of the pressing member 32 was made of iron.

After setting the semiconductor wafer 10 inside the support member 33, the protective film 20 was supplied in a batch manner in the arrangement step, and the protective film 20 was arranged so as to cover the main surface 10A of the semiconductor wafer 10.

Thereafter, the heating temperature of the protective film 20 was set to 80° C., the pressing force by the pressing member 32 was set to 0.7 MPa, and each step was performed in the order of the affixing step and the compression step to affix the protective film 20 to the main surface 10A of the semiconductor wafer 10.

Then, in the peripheral edge part of the protective film 20, a surplus portion protruding from the outer peripheral edge of the semiconductor wafer 10 was cut off to obtain a sample of Example 1.

Comparative Example 1

A sample of Comparative Example 1 was obtained by affixing the protective film 20 to the main surface 10A of the semiconductor wafer 10 and cutting off a surplus portion of the peripheral edge part of the protective film 20 in the same manner as in Example 1 except that a roll pasting apparatus (product number "DR-3000 II" manufactured by Nitto Seiki Co., Ltd.) was used and that the support member 33 was not used.

Comparative Example 2

A sample of Comparative Example 2 was obtained by affixing the protective film 20 to the main surface 10A of the semiconductor wafer 10 and cutting off a surplus portion of the peripheral edge part of the protective film 20 in the same manner as in Example 1 except that the pressing surface 32A was made of silicone rubber and that the support member 33 was not used in the affixing apparatus 30 illustrated in FIG. 1.

[4] Measurement of Unevenness on Surface of Protective Film

Figure 19:
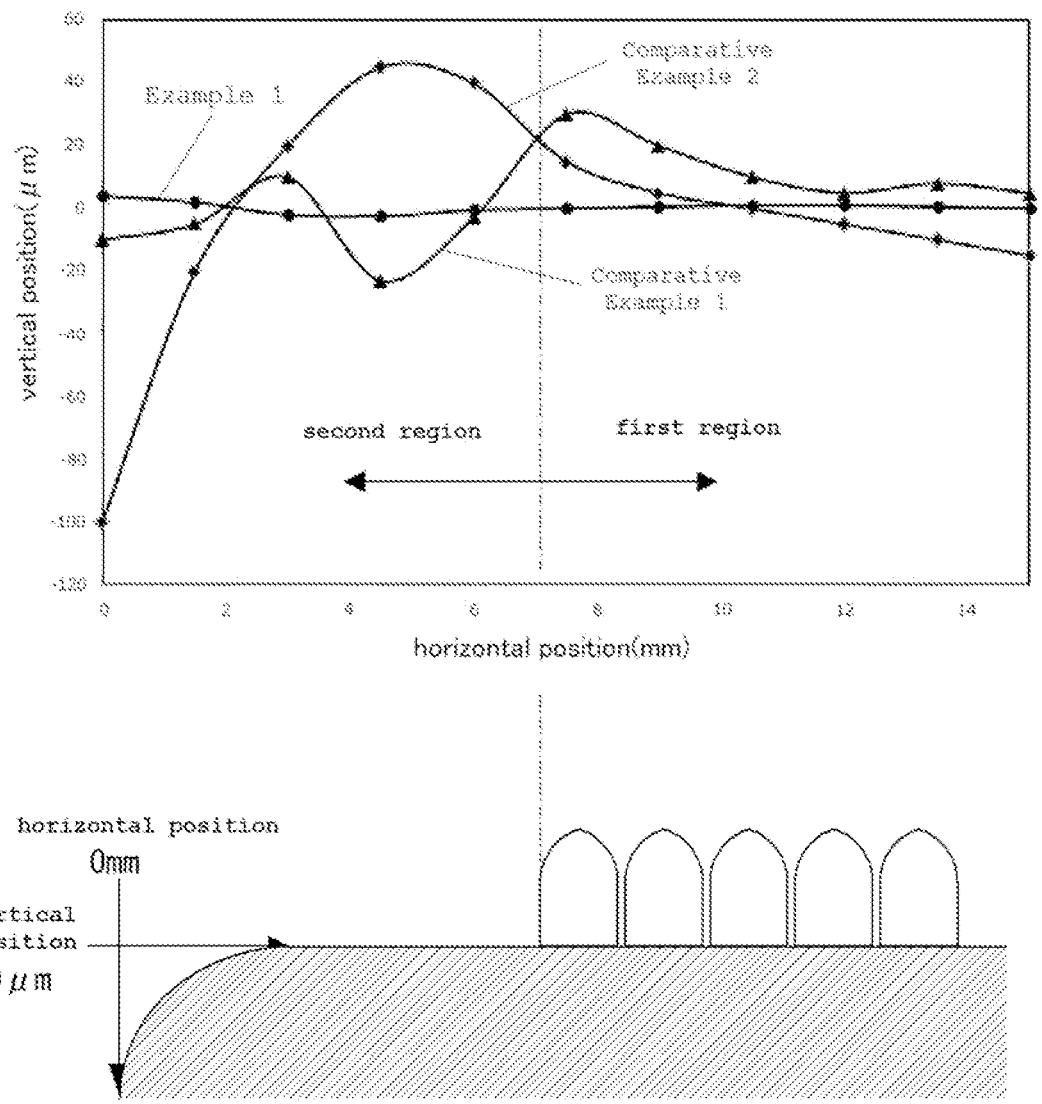
FIG. 19 is a graph for explaining results of measuring unevenness on a surface of a protective film in the Example.

At the end of the peripheral edge of the semiconductor wafer, the vertical position of the surface of the protective film at a predetermined horizontal position was measured with the position shown in the explanatory diagram in the lower part of FIG. 19 as a horizontal position of 0 mm and a vertical position of 0 μm. The results are shown graphically in the upper part of FIG. 19.

Note that, in the explanatory diagram in the lower part of FIG. 19, the horizontal position is drawn to correspond to the upper graph, and the vertical position is drawn to be exaggerated.

As a result of measuring the vertical position of the surface of the protective film, the following facts were found from the graph in FIG. 19.

In Example 1, there was almost no height difference in the vertical position at any horizontal position, and the surface of the protective film was flat.

In Comparative Example 1, the vertical position is low around a horizontal position of 4 mm, that is, in the second region, and the vertical position is high in the range where the horizontal position is 7 to 8 mm, that is, in the first region. From this result, it was found that, in Comparative Example 1, a dent was formed on the surface of the protective film in the second region so as to correspond to the step generated between the second region and the first region.

In Comparative Example 2, the vertical position tends to increase in the range where the horizontal position is 5 mm or less, that is, in the second region, while the vertical position tends to decrease in the range where the horizontal position is 7 mm or more, that is, in the first region. From this result, it was found that, in Comparative Example 2, the protective film was bent in a mountain shape in the second region due to the influence of the step generated between the second region and the first region, and that a dent was formed on the surface of the protective film in the first region.

INDUSTRIAL APPLICABILITY

The affixing apparatus of the present invention is widely used in applications of affixing a film to a plate-shaped body. In particular, in a semiconductor wafer subjected to a back grinding step as a plate-shaped body, it has a characteristic of capable of suitably flattening a surface of a protective film, and thus is suitably used for manufacturing a component excellent in productivity.

REFERENCE SIGNS LIST

10 Semiconductor wafer
10A Main surface
11 Bump
12 First region
13 Second region
13A Peripheral edge region
13B Blank region
14 Chamfered portion
20 Protective film
20A Processed film
21 Base layer
22 Adhesive layer
23 Unevenness absorption layer
30 Affixing apparatus
31 Mounting member
31A Mounting portion
32 Pressing member
32A Pressing surface
33 Support member
33A Support surface
35A Guide roller
35B Traction roller
36 Heater
40 Processing device 41 First roller
42 Second roller
43 Protrusion
45 Support column

The invention claimed is:

1. An affixing apparatus for affixing a film to a plate-shaped body, comprising:
    a plate-shaped mounting member provided with a mounting portion on which the plate-shaped body is mounted;
    a plate-shaped pressing member installed at a position facing the mounting member; and
    a support member installed at an outer edge of the mounting portion so as to be positioned between the mounting member and the pressing member,
    wherein the pressing member has a pressing surface on its entire lower surface, the pressing surface is a flat surface, and when the pressing surface is in contact with the film, a surface of the film is flattened, and
    wherein the affixing apparatus has a function of sandwiching an edge part of the film between the support member and the pressing member and compressing the edge part in a thickness direction of the film.

2. The affixing apparatus according to claim 1,
    wherein the pressing member has a function of pressing the film against a main surface of the plate-shaped body, and
    wherein the support member has a function of supporting an edge part of the film when the film is pressed by the pressing member.

3. The affixing apparatus according to claim 1, further comprising an arrangement device that arranges the film on a main surface of the plate-shaped body.

4. The affixing apparatus according to claim 1, further comprising a heating device that heats the film.

5. The affixing apparatus according to claim 1,
    wherein the plate-shaped body comprises a notch-shaped step portion at a peripheral edge part of a main surface to which the film is affixed, and
    wherein the support member is installed at an outer edge of the mounting portion such that the support member corresponds to the step portion.

6. The affixing apparatus according to claim 1,
    wherein the plate-shaped body is a semiconductor wafer, and
    wherein the film is a protective film for a semiconductor wafer.

7. The affixing apparatus according to claim 6,
    wherein the semiconductor wafer has, on the main surface, a first region in which bumps are arranged, and a second region which includes at least a part of a peripheral edge of a main surface and in which no bumps are arranged, and
    wherein a notch-shaped step portion is formed by the second region.

8. An affixing apparatus for affixing a film to a plate-shaped body,
    wherein the plate-shaped body comprises a step portion on a main surface to which the film is affixed, and
    wherein the affixing apparatus comprises:
    a plate-shaped mounting member provided with a mounting portion on which the plate-shaped body is mounted;
    a plate-shaped pressing member installed at a position facing the mounting member;
    an arrangement device installed between the mounting member and the pressing member to arrange the film on the main surface of the plate-shaped body; and
    a processing device that forms a part with a relatively large thickness in the film arranged on the main surface of the plate-shaped body, corresponding to the step portion.

9. The affixing apparatus according to claim 8, further comprising a heating device that heats the film.

10. The affixing apparatus according to claim 8,
    wherein the plate-shaped body is a semiconductor wafer, and
    wherein the film is a protective film for a semiconductor wafer.

* * * * *